US008829778B2

(12) United States Patent
Sakuta et al.

(10) Patent No.: US 8,829,778 B2
(45) Date of Patent: Sep. 9, 2014

(54) WHITE LIGHT-EMITTING SEMICONDUCTOR DEVICES

(71) Applicants: Hiroaki Sakuta, Ibaraki (JP); Kazuhiko Kagawa, Mie (JP); Yoshihito Satou, Ibaraki (JP); Hiroaki Okagawa, Tokyo (JP); Shin Hiraoka, Ibaraki (JP)

(72) Inventors: Hiroaki Sakuta, Ibaraki (JP); Kazuhiko Kagawa, Mie (JP); Yoshihito Satou, Ibaraki (JP); Hiroaki Okagawa, Tokyo (JP); Shin Hiraoka, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 14/041,171

(22) Filed: Sep. 30, 2013

(65) Prior Publication Data

US 2014/0042896 A1 Feb. 13, 2014

Related U.S. Application Data

(63) Continuation of application No. 13/292,507, filed on Nov. 9, 2011, now Pat. No. 8,581,488, which is a continuation of application No. PCT/JP2010/064306, filed on Aug. 24, 2010.

(30) Foreign Application Priority Data

Aug. 26, 2009  (JP) .................................. 2009-195765
Feb. 1, 2010  (JP) .................................. 2010-020482
Mar. 3, 2010  (JP) .................................. 2010-047173
Jun. 25, 2010  (JP) .................................. 2010-145095
Aug. 9, 2010  (JP) .................................. 2010-179063

(51) Int. Cl.
*H01L 33/08* (2010.01)

(52) U.S. Cl.
USPC ............................ 313/501; 313/512; 313/507

(58) Field of Classification Search
USPC ............. 313/500–512; 252/301.4 P, 301.4 R, 252/301.6 P
See application file for complete search history.

(56) References Cited

U.S. PATENT DOCUMENTS 4,176,299 A   11/1979  Thornton, Jr.
6,717,353 B1  4/2004   Mueller et al.
(Continued)

FOREIGN PATENT DOCUMENTS

EP  1 145 282 A2  10/2001
EP  1 571 715 A1   9/2005
(Continued)

OTHER PUBLICATIONS

W.A. Thornton—"Luminosity and Color-Rendering Capability of White Light", Journal of the Optical Society of America, vol. 61, No. 9, Sep. 1971, pp. 1155-1163.

(Continued)

*Primary Examiner* — Tracie Y Green
(74) *Attorney, Agent, or Firm* — Oblon, Spivak, McClelland, Maier & Neustadt, L.L.P.

(57) ABSTRACT

A white light-emitting semiconductor device having improved reproducibility of bright red. The device outputs light having a blue component, a green component, and a red component. Each of the light components (blue, green, and red) is based on a light-emitting semiconductor element and/or a phosphor that absorbs light emitted by a light-emitting semiconductor element and emits light through wavelength conversion. The outputted light has a spectrum which has a maximum wavelength in the range of 615-645 nm, and the intensity at a wavelength of 580 nm of the outputted light, which has been normalized with respect to luminous flux, is 80-100% of the intensity at a wavelength of 580 nm of standard light for color rendering evaluation, which has been normalized with respect to luminous flux.

15 Claims, 7 Drawing Sheets

(56) References Cited

U.S. PATENT DOCUMENTS

| | | |
|---|---|---|
| 7,391,060 B2 | 6/2008 | Oshio |
| 8,581,488 B2 * | 11/2013 | Sakuta et al. .................. 313/501 |
| 2004/0119086 A1 | 6/2004 | Yano et al. |
| 2006/0045832 A1 | 3/2006 | Nagatomi et al. |
| 2007/0007494 A1 | 1/2007 | Hirosaki et al. |
| 2007/0052342 A1 | 3/2007 | Masuda et al. |
| 2008/0150412 A1 | 6/2008 | Yoshimatsu |
| 2008/0180948 A1 | 7/2008 | Yoon et al. |
| 2009/0033201 A1 | 2/2009 | Shimooka et al. |
| 2009/0066230 A1 | 3/2009 | Hirosaki et al. |
| 2009/0072255 A1 | 3/2009 | Takahashi et al. |
| 2009/0140205 A1 | 6/2009 | Kijima et al. |
| 2009/0146549 A1 | 6/2009 | Kimura et al. |
| 2009/0166584 A1 | 7/2009 | Shimooka et al. |
| 2009/0224652 A1 | 9/2009 | Li et al. |
| 2010/0025700 A1 | 2/2010 | Jung et al. |
| 2010/0244076 A1 | 9/2010 | Schmidt et al. |
| 2010/0295464 A1 | 11/2010 | Kasakura et al. |
| 2012/0112626 A1 | 5/2012 | Sakuta et al. |
| 2012/0212123 A1 | 8/2012 | Sakuta et al. |
| 2012/0267999 A1 | 10/2012 | Sakuta et al. |
| 2012/0286646 A1 | 11/2012 | Sakuta et al. |
| 2012/0319565 A1 * | 12/2012 | Sakuta et al. .................. 313/503 |
| 2013/0082289 A1 | 4/2013 | Sakuta et al. |
| 2013/0264937 A1 | 10/2013 | Sakuta et al. |
| 2013/0277694 A1 | 10/2013 | Sakuta et al. |

FOREIGN PATENT DOCUMENTS

| | | |
|---|---|---|
| EP | 1 630 220 A2 | 3/2006 |
| EP | 1 630 220 A3 | 3/2006 |
| JP | 2004-103443 | 4/2004 |
| JP | 2004-134805 | 4/2004 |
| JP | 2004-193581 | 7/2004 |
| JP | 2005-226000 | 8/2005 |
| JP | 2006-8721 | 1/2006 |
| JP | 2006-49553 | 2/2006 |
| JP | 2006-49799 | 2/2006 |
| JP | 2006-63233 | 3/2006 |
| JP | 2007-109837 | 4/2007 |
| JP | 2007-158298 | 6/2007 |
| JP | 2007-231245 | 9/2007 |
| JP | 2008-7751 | 1/2008 |
| JP | 2008-034188 | 2/2008 |
| JP | 2008-50379 | 3/2008 |
| JP | 2008-150549 | 7/2008 |
| JP | 2008-166825 | 7/2008 |
| JP | 2008-169395 | 7/2008 |
| JP | 2008-244469 | 10/2008 |
| JP | 2008-270781 | 11/2008 |
| JP | 2009-16127 | 1/2009 |
| JP | 2009-231525 | 10/2009 |
| JP | 2009-251511 | 10/2009 |
| JP | 2010-039206 | 2/2010 |
| JP | 2010-267571 | 11/2010 |
| WO | 2006-126567 | 11/2006 |
| WO | 2007/105631 | 9/2007 |
| WO | 2008/020541 A1 | 2/2008 |
| WO | 2009/063915 | 5/2009 |
| WO | 2009/072043 A1 | 6/2009 |

OTHER PUBLICATIONS

G. Chen et al.—"Performance of high-power III-nitride light emitting diodes", phys. stat. sol. (a) 205, No. 5, pp. 1086-1092.

International Search Report issued in PCT/JP2010/064306 mailed Sep. 21, 2010.

Extended European Search Report issued Mar. 12, 2014 in Patent Application No. 10811868.8.

* cited by examiner

RELATIONSHIP BETWEEN 580-nm INTENSITY RATIO AND R9 (1)

RELATIONSHIP BETWEEN 580-nm INTENSITY RATIO AND R9 (2)

RELATIONSHIP BETWEEN 580-nm INTENSITY RATIO AND R9 (3)

US 8,829,778 B2

WHITE LIGHT-EMITTING SEMICONDUCTOR DEVICES

CROSS-REFERENCE TO RELATED APPLICATIONS

This application is a Continuation of U.S. patent application Ser. No. 13/292,507 filed Nov. 9, 2011, which claims priority to PCT/JP10/064,306 filed Aug. 24, 2010, which claims priority to Japanese Patent Application Nos. 2009-195765 filed Aug. 26, 2009, 2010-020482 filed Feb. 1, 2010, 2010-047173 filed Mar. 3, 2010, 2010-145095 filed Jun. 25, 2010, and 2010-179063 filed Aug. 9, 2010, the entire contents of each of which are hereby incorporated by reference.

TECHNICAL FIELD

The present invention relates to white light-emitting devices which output white light suitable for illumination. More particularly, the invention relates to white light-emitting semiconductor devices which are equipped with phosphors as light-emitting factors and with a light-emitting semiconductor element as an excitation source for the phosphors.

In the invention and in this description, light having a color which has deviations Duv from the black-body radiation locus in the range of −20 to +20 is called white light. The definition of Duv (=1,000 duv) is in accordance with JIS Z 8725:1999 "Method for Determining Distribution Temperature and Color Temperature or Correlated Color Temperature of Light Sources".

BACKGROUND ART

White LEDs which are a kind of white light-emitting semiconductor device configured so as to output white light on the basis of a combination of a gallium nitride-based light-emitting diode (LED) element and a phosphor have recently come to be used also in illumination applications.

In illumination applications, there is a demand for white LEDs having a color temperature of 3,500K or lower (patent document 1). Production of white LEDs which have such a low color temperature and have a high luminance that renders the LEDs usable in illumination became possible due to a success in the development of high-luminance red phosphors. Examples of the high-luminance red phosphors include red phosphors in which $Eu^{2+}$ is used as an activator and crystals containing an alkaline earth siliconitride, alkaline earth silicate nitride, or alkaline earth silicate are used as a base, such as $CaAlSiN_3$:Eu, which is disclosed in patent document 2, (Sr, Ca)$AlSiN_3$:Eu, which is disclosed in patent document 3, $Ca_{1-x}Al_{1-x}Si_{1+x}N_{3-x}O_x$:Eu, which is disclosed in patent document 4, and (Sr, Ba)$_3SiO_5$:Eu, which is disclosed in patent document 5. These red phosphors have a broad emission band having a full width at half maximum exceeding 80 nm and, hence, white LEDs employing these phosphors usually have a high color rendering index (CR1).

PRIOR-ART DOCUMENTS

Patent Documents

Patent Document 1: JP-A-2004-103443
Patent Document 2: JP-A-2006-8721
Patent Document 3: JP-A-2008-7751
Patent Document 4: JP-A-2007-231245
Patent Document 5: JP-A-2008-50379

SUMMARY OF THE INVENTION

Problem that the Invention is to Solve

However, white light-emitting semiconductor devices tend to be reduced in the reproducibility regarding bright red for which R9, which is one of the special color rendering indexes, is used as an index. This tendency is pronounced in white light-emitting semiconductor devices having a low color temperature, such as LED lamps which emit white light having a color temperature of 2,000-4,000K and are called warm white LEDs.

A major object of the invention is to provide a white light-emitting semiconductor device having improved reproducibility regarding bright red.

Means for Solving the Problem

Essential points of the invention reside in the followings 1. to 6.

1. A white light-emitting semiconductor device which outputs light comprising a blue light component, a green light component, and a red light component, wherein the blue light component includes light having any wavelength in the range of 440-480 nm, the green light component includes light having any wavelength in the range of 515-560 nm, and the red light component includes light having any wavelength in the range of 615-645 nm, and a source of the blue light component comprises a light-emitting semiconductor element and/or a first phosphor that absorbs the light emitted by a light-emitting semiconductor element and emits, through wavelength conversion, light including the blue light component, a source of the green light component comprises a second phosphor that absorbs the light emitted by a light-emitting semiconductor element and emits, through wavelength conversion, light including the green light component, and a source of the red light component comprises a third phosphor that absorbs the light emitted by a light-emitting semiconductor element and emits, through wavelength conversion, light including the red light component, the outputted light has a spectrum which has a maximum wavelength in the range of 615-645 nm, and an intensity at a wavelength of 580 nm of the spectrum of the outputted light which has been normalized with respect to luminous flux is 80-100% of an intensity at a wavelength of 580 nm of the spectrum of standard light for color rendering evaluation which has been normalized with respect to luminous flux. In this white light-emitting semiconductor device, the first phosphor preferably includes a blue phosphor, the second phosphor preferably includes a green phosphor, and the third phosphor preferably includes a red phosphor. Furthermore, the second phosphor and/or the third phosphor may include a yellow phosphor.

2. The white light-emitting semiconductor device according to 1. above wherein the outputted light has a spectrum which has a maximum wavelength in the range of 615 or more and less than 630 nm, and an intensity at a wavelength of 580 nm of the spectrum of the outputted light which has been normalized with respect to luminous flux is 85-100%, preferably 85-95%, of an intensity at a wavelength of 580 nm of the spectrum of standard light for color rendering evaluation which has been normalized with respect to luminous flux.

3. The white light-emitting semiconductor device according to 1. above, wherein the outputted light has a spectrum which has a maximum wavelength in the range of 630-645 nm, and an intensity at a wavelength of 580 nm of the spectrum of the outputted light which has been normalized with respect to luminous flux is 90-100% of an intensity at a wavelength of 580 nm of the spectrum of standard light for color rendering evaluation which has been normalized with respect to luminous flux.

4. The white light-emitting semiconductor device according to any one of 1. to 3. above, wherein the third phosphor comprises a first red phosphor and a second red phosphor, and the second red phosphor has a lower relative intensity at a wavelength of 580 nm in an emission spectrum, when the intensity at the peak wavelength is taken as 1, than in the first red phosphor. In this white light-emitting semiconductor device, the difference between the relative intensity at a wavelength of 580 nm of the emission spectrum of the first red phosphor, with the intensity at the peak wavelength being taken as 1, and the relative intensity at a wavelength of 580 nm of the emission spectrum of the second red phosphor, with the intensity at the peak wavelength being taken as 1, is preferably 0.2 or more, more preferably 0.3 or more.

5. The white light-emitting semiconductor device according to 4. above, wherein a peak wavelength of the emission spectrum of the second red phosphor is present at a longer wavelength side than that of the emission spectrum of the first red phosphor.

6. The white light-emitting semiconductor device according to 4. or 5. above, wherein at the first red phosphor includes $Sr_xCa_{1-x}AlSiN_3$:Eu (0<x<1), $Ca_{1-x}Al_{1-x}Si_{1+x}N_{3-x}O_x$:Eu, or $SrAlSi_4N_7$:Eu. In this white light-emitting semiconductor device, it is preferred that a relative intensity of the second red phosphor at a wavelength of 580 nm in an emission spectrum, with the intensity at the peak wavelength being taken as 1, is 0.05 or less. In this white light-emitting semiconductor device, the second red phosphor preferably includes $CaAlSiN_3$:Eu.

Other essential points of the invention reside in the followings 7. to 13.

7. A white light-emitting unit which emits white light containing a blue light component, a green light component, and a red light component, wherein the blue light component includes light having any wavelength in the range of 440-480 nm, the green light component includes light having any wavelength in the range of 515-560 nm, and the red light component includes light having any wavelength in the range of 615-645 nm, and the white light-emitting unit comprises a light-emitting semiconductor element, a first phosphor that absorbs the light emitted by the light-emitting semiconductor element and emits, through wavelength conversion, light including the blue light component, a second phosphor that absorbs the light emitted by the light-emitting semiconductor element and emits, through wavelength conversion, light including the green light component, and a third phosphor that absorbs the light emitted by the light-emitting semiconductor element and emits, through wavelength conversion, light including the red light component, the white light has a spectrum which has a maximum wavelength in the range of 615-645 nm, and an intensity at a wavelength of 580 nm of the spectrum of the white light which has been normalized with respect to luminous flux is 80-100% of an intensity at a wavelength of 580 nm of the spectrum of standard light for color rendering evaluation which has been normalized with respect to luminous flux.

In this white light-emitting unit, the first phosphor preferably includes a blue phosphor, the second phosphor preferably includes a green phosphor, and the third phosphor preferably includes a red phosphor. Furthermore, the second phosphor and/or the third phosphor may include a yellow phosphor.

8. A white light-emitting unit which emits white light containing a blue light component, a green light component, and a red light component, wherein the blue light component includes light having any wavelength in the range of 440-480 nm, the green light component includes light having any wavelength in the range of 515-560 nm, and the red light component includes light having any wavelength in the range of 615-645 nm, and the white light-emitting unit comprises a light-emitting semiconductor element that emits light including the blue light component, a second phosphor that absorbs the light emitted by the light-emitting semiconductor element and emits, through wavelength conversion, light including the green light component, and a third phosphor that absorbs the light emitted by the light-emitting semiconductor element and emits, through wavelength conversion, light including the red light component, the white light has a spectrum which has a maximum wavelength in the range of 615-645 nm, and an intensity at a wavelength of 580 nm of the spectrum of the white light which has been normalized with respect to luminous flux is 80-100% of the intensity at a wavelength of 580 nm of the spectrum of standard light for color rendering evaluation which has been normalized with respect to luminous flux. In this white light-emitting unit, the second phosphor preferably includes a green phosphor, and the third phosphor preferably includes a red phosphor. Furthermore, the second phosphor and/or the third phosphor may include a yellow phosphor.

9. The white light-emitting unit according to 7. or 8. above, wherein the white light has a spectrum which has a maximum wavelength in the range of 615 nm or more and less than 630 nm, and an intensity at a wavelength of 580 nm of the spectrum of the white light which has been normalized with respect to luminous flux is 85-100%, preferably 85-95%, of an intensity at a wavelength of 580 nm of the spectrum of standard light for color rendering evaluation which has been normalized with respect to luminous flux.

10. The white light-emitting unit according to 7. or 8. above, wherein the white light has a spectrum which has a maximum wavelength in the range of 630-645 nm, and an intensity at a wavelength of 580 nm of the spectrum of the white light which has been normalized with respect to luminous flux is 90-100% of an intensity at a wavelength of 580 nm of the spectrum of standard light for color rendering evaluation which has been normalized with respect to luminous flux.

11. The white light-emitting unit according to any of 7. to 10. above, wherein the third phosphor comprises a first red phosphor and a second red phosphor, and the second red phosphor has a lower relative intensity at a wavelength of 580 nm in an emission spectrum, with the intensity at the peak wavelength being taken as 1, than in the first red phosphor. In this white light-emitting unit, the difference between the relative intensity at a wavelength of 580 nm of the emission spectrum of the first red phosphor, with the intensity at the peak wavelength being taken as 1, and the relative intensity at a wavelength of 580 nm of the emission spectrum of the second red phosphor, with the intensity at the peak wavelength being taken as 1, is preferably 0.2 or more, more preferably 0.3 or more.

12. The white light-emitting unit according to 11. above, wherein a peak wavelength of the emission spectrum of the second red phosphor is present at a longer wavelength side than that of the emission spectrum of the first red phosphor.

13. The white light-emitting unit according to 11. or 12. above, wherein the first red phosphor includes $Sr_xCa_{1-x}AlSiN_3$:Eu (0<x<1), $Ca_{1-x}Al_{1-x}Si_{1+x}N_{3-x}O_x$:Eu, or $SrAlSi_4N_7$:Eu. In this white light-emitting unit, it is preferred that the relative intensity of the second red phosphor at a wavelength of 580 nm in an emission spectrum, with the intensity at the peak wavelength being taken as 1, is 0.05 or less. In this white light-emitting unit, the second red phosphor preferably includes $CaAlSiN_3:Eu$.

Still other essential points of the invention reside in the followings 14. to 16.

14. A white light-emitting semiconductor device comprising first to Nth (wherein N is an integer of 2 or larger) white light-emitting units each equipped with a light-emitting semiconductor element and a wavelength conversion part, in which the first to Nth white light-emitting units each emit primary white light and the primary white light emitted by the units is mixed together, to form combined light as outputted light, and the first to Nth white light-emitting units comprise a white light-emitting unit which emits first primary white light and a white light-emitting unit which emits second primary white light, and an intensity at a wavelength of 580 nm of the spectrum of the first primary white light which has been normalized with respect to luminous flux is higher than an intensity at a wavelength of 580 nm of the spectrum of standard light for color rendering evaluation which has been normalized with respect to luminous flux, and an intensity at a wavelength of 580 nm of the spectrum of the second primary white light which has been normalized with respect to luminous flux is lower than an intensity at a wavelength of 580 nm of the spectrum of standard light for color rendering evaluation which has been normalized with respect to luminous flux, and the outputted light has a spectrum which has a maximum wavelength in the range of 615-645 nm, and an intensity at a wavelength of 580 nm of the spectrum of the outputted light which has been normalized with respect to luminous flux is 80-100% of an intensity at a wavelength of 580 nm of the spectrum of standard light for color rendering evaluation which has been normalized with respect to luminous flux.

15. The white light-emitting semiconductor device according to 14. above, wherein the white light-emitting unit which emits first primary white light comprises a wavelength conversion part including a first red phosphor, and the white light-emitting unit which emits second primary white light comprises a wavelength conversion part including a second red phosphor, and the second red phosphor has a lower relative intensity at a wavelength of 580 nm in an emission spectrum, when the intensity at the peak wavelength is taken as 1, than in the first red phosphor.

16. The white light-emitting semiconductor device according to 14. or 15. above, wherein a difference in reciprocal correlated color temperature between the first primary white light and the second primary white light is 50 $MK^{-1}$ or less, preferably 25 $MK^{-1}$ or less.

Effect of the Invention

According to the invention, a white light-emitting semiconductor device having improved reproducibility regarding bright red is provided.

MODES FOR CARRYING OUT THE INVENTION

Figure 1:
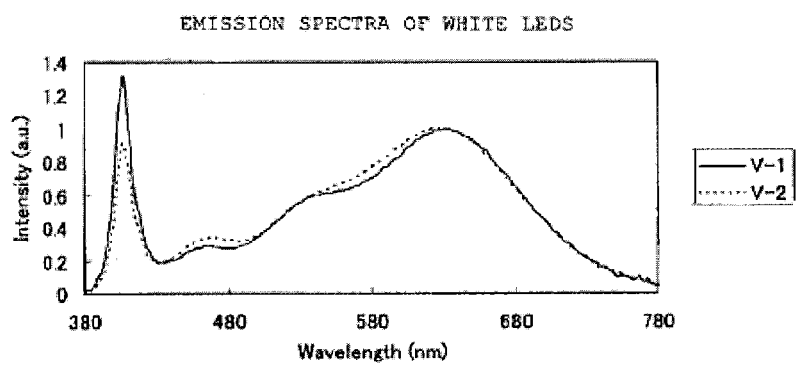
FIG. 1 shows emission spectra of white LEDs.

The white light-emitting semiconductor devices of the invention preferably include at least one white light-emitting unit. The white light-emitting unit includes a light-emitting semiconductor element and a phosphor which converts the wavelengths of the light emitted by the light-emitting semiconductor element, and emits white light. There are no limitations on the configuration of optical coupling of the light-emitting semiconductor element and the phosphor in the white light-emitting unit. The space between the two may be merely in the state of being filled with a transparent medium (including air), or an optical element such as, for example, a lens, optical fiber, lightguide plate, or reflecting mirror may have been interposed between the two.

A light-emitting semiconductor element which emits light having a wavelength range of 360-490 nm can be advantageously used in the white light-emitting unit. The kind of the semiconductor which constitutes the light-emitting part of the light-emitting semiconductor element and the structure of the light-emitting part are not particularly limited. Preferred light-emitting semiconductor elements are light-emitting diode elements having a pn junction type light-emitting part containing a gallium nitride-based, zinc oxide-based, or silicon carbide-based semiconductor.

The state of the phosphor to be used in the white light-emitting unit is not particularly limited, and the phosphor may be in a powder form or may be a light-emitting ceramic containing a ceramic structure in which a phosphor phase is contained. The powder-form phosphor is fixed by a suitable method before being used. The method for fixing is not particularly limited. However, it is preferred to disperse particles of the phosphor in a transparent solid matrix made of a polymeric material or glass or to deposit particles of the phosphor in a layered arrangement on a surface of a suitable member by electrodeposition or another technique.

A preferred white light-emitting unit is equipped with a blue light-emitting diode element, a green phosphor, and a red phosphor, and emits white light which contains, as components thereof, part of the blue light emitted by the blue light-emitting diode element, green light generated from other part of the blue light through wavelength conversion by the green phosphor, and red light generated from still other part of the blue light through wavelength conversion by the red phosphor. The blue light-emitting diode element usually has an emission peak wavelength of 440-470 nm. This white light-emitting unit may be further equipped with a phosphor which absorbs part of the blue light emitted by the blue light-emitting diode element and emits yellow light.

Another preferred white light-emitting unit is equipped with an ultraviolet light-emitting diode element or purple light-emitting diode element, a blue phosphor, a green phosphor, and a red phosphor, and emits white light which contains, as components thereof, blue light generated from part of the ultraviolet light or purple light emitted by the light-emitting diode element through wavelength conversion by the blue phosphor, green light generated from other part of the ultraviolet light or purple light through wavelength conversion by the green phosphor, and red light generated from still other part of the ultraviolet light or purple light through conversion by the red phosphor. In the case of using a purple light-emitting diode element, part of the purple light emitted by the element may be contained as a component of the white light. In this white light-emitting unit, use of a purple light-emitting diode element is preferred to use of an ultraviolet light-emitting diode element because the former element brings about a reduction in Stokes shift loss.

The currently available purple light-emitting diode elements which are highest in efficiency are InGaN-based purple light-emitting diode elements. An InGaN-based light-emitting diode element is a pn junction type light-emitting diode element equipped with a double hetero-structure in which an MQW active layer including an InGaN well layer has been sandwiched between p type and n type GaN-based clad layers, and it is known that this light-emitting diode element has a maximum luminescent efficiency when regulated so as to have an emission peak wavelength in the range of 410-430 nm (G. Chen, et al., *Phys. Stat. Sol.* (a) 205, No. 5, 1086-1092 (2008)). Meanwhile, in high-efficiency blue phosphors, the excitation efficiency is generally high in the ultraviolet to near-ultraviolet regions and abruptly decreases with increasing wavelength on the longer-wavelength side of a wavelength of 405 nm. When such excitation characteristics of the blue phosphors is taken into account, the purple light-emitting diode element most suitable for a white light-emitting unit is an InGaN-based light-emitting diode element which has an emission peak wavelength in the range of 400-420 nm, in particular, in the range of 405-415 nm.

There are no particular limitations on the configuration of the white light-emitting unit, and reference can be made at will to the configurations of known white light-emitting devices based on a combination of a light-emitting semiconductor element and a phosphor. A preferred example includes the structure of a general white LED. Namely, the white light-emitting unit can be made to have a structure obtained by mounting one or more light-emitting diode elements in a package, e.g., a shell type package or an SMD type package, and encapsulating the package with a light-transmitting encapsulating material to which a phosphor has been added.

In a white light-emitting unit according to another preferred example, a light-emitting diode element is directly mounted on a circuit board without using a package. This white light-emitting unit includes a so-called chip-on-board type unit. A phosphor is disposed by a suitable method in a position which is irradiated with the light emitted by the light-emitting diode element. For example, a light-transmitting silicone resin composition containing a phosphor powder dispersed therein is applied to the surface of the light-emitting diode element. Alternatively, a phosphor powder is deposited on the surface of the light-emitting diode element by a technique such as electrodeposition. In still another method, a light-transmitting sheet which contains a phosphor and which has been prepared in a separate step is disposed over the light-emitting diode element. This sheet may be a sheet containing a light-emitting ceramic which contains a phosphor phase, or may be a film made of a light-transmitting resin composition in which a phosphor powder has been dispersed. This film may be a film superposed on a surface of a transparent plate made of a resin, glass, etc.

The white light-emitting semiconductor devices of the invention may be a device which is equipped with a plurality of white light-emitting units and by which combined light obtained by mixing the primary white light emitted by the individual white light-emitting units is outputted. In this embodiment, the plurality of white light-emitting units can include two white light-emitting units which differ from each other in emission spectrum.

It is not essential that the white light-emitting semiconductor devices of the invention should be equipped with a white light-emitting unit. A possible example is equipped with a blue light-emitting unit, a green light-emitting unit, and a red light-emitting unit and outputs white light which contains, as components thereof, blue light emitted by the blue light-emitting unit, green light emitted by the green light-emitting unit, and red light emitted by the red light-emitting unit. The blue light-emitting unit is a light-emitting unit which is equipped with an ultraviolet light-emitting diode element or purple light-emitting diode element and a blue phosphor and which has been configured so that the ultraviolet light or purple light emitted by the light-emitting diode element undergoes wavelength conversion by the action of the blue phosphor and the resultant blue light is emitted. The green light-emitting unit is a light-emitting unit which is equipped with an ultraviolet light-emitting diode element or purple light-emitting diode element and a green phosphor and which has been configured so that the ultraviolet light or purple light emitted by the light-emitting diode element undergoes wavelength conversion by the action of the green phosphor and the resultant green light is emitted. The red light-emitting unit is a light-emitting unit which is equipped with an ultraviolet light-emitting diode element or purple light-emitting diode element and a red phosphor and which has been configured so that the ultraviolet light or purple light emitted by the light-emitting diode element undergoes wavelength conversion by the action of the red phosphor and the resultant red light is emitted.

The white light-emitting semiconductor devices of the invention may be a device which is equipped with various kinds of light-emitting units, such as the blue light-emitting unit, green light-emitting unit, and red light-emitting unit described above, besides a white light-emitting unit and by which combined light obtained by mixing the light emitted by the individual light-emitting units is outputted.

The white light-emitting semiconductor devices of the invention output light which contains a blue light component, a green light component, and a red light component regardless of whether the devices are equipped with a white light-emitting unit or not. The blue light component at least includes light having any wavelength in the range of 440-480 nm, the green light component at least includes light having any wavelength in the range of 515-560 nm, and the red light component at least includes light having any wavelength in the range of 615-645 nm. The source of the blue light component includes a light-emitting semiconductor element and/or a phosphor which absorbs the light emitted by the light-emitting semiconductor element and emits, through wavelength conversion, light including the blue light component. On the other hand, the source of the green light component essentially includes a phosphor which absorbs the light emitted by a light-emitting semiconductor element and emits, through wavelength conversion, light including the green light component. Furthermore, the source of the red light component essentially includes a phosphor which absorbs the light emitted by a light-emitting semiconductor element and emits, through wavelength conversion, light including the red light component. To use phosphors, which have a broader emission band than light-emitting semiconductor elements, as sources of the green light component and red light component is an exceedingly important factor in obtaining a white light-emitting device having satisfactory color rendering properties.

In the white light-emitting semiconductor devices of the invention, a suitable light-emitting semiconductor element which is usable as a source of the blue light component is an InGaN-based blue light-emitting diode element. A preferred example may be equipped with a first light-emitting diode element having an emission peak wavelength in the range of 440-470 nm and a second light-emitting diode element having an emission peak wavelength in the range of 470-500 nm, from the standpoint of enhancing color rendering properties. In this configuration, the emission peak wavelength of the first light-emitting diode element and the emission peak wavelength of the second light-emitting diode element are separated from each other by 10 nm or more, preferably by 20 nm or more. As the InGaN-based light-emitting diode element having an emission peak wavelength in the range of 470-500 nm, use can advantageously be made of a light-emitting diode element produced by depositing a GaN-based semiconductor including a light-emitting InGaN layer on a nonpolar or semipolar GaN substrate by epitaxial growth.

In the white light-emitting semiconductor devices of the invention, a blue phosphor capable of being excited by ultraviolet to purple light can be advantageously used as a source for emitting the blue light component through wavelength conversion. The term "blue phosphor" means a phosphor which emits light having a color that is classified as "PURPULISH BLUE", "BLUE", or "GREENISH BLUE" in the xy chromaticity diagram (CIE 1931) shown in FIG. 19. The kind of this blue phosphor is not particularly limited. However, suitable examples thereof include blue phosphors each composed of $Eu^{2+}$ as an activator and crystals containing an alkaline earth aluminate or alkaline earth halophosphate as a base, such as, for example, $(Ba, Sr, Ca)MgAl_{10}O_{17}$:Eu and $(Ca, Sr, Ba)_5(PO_4)_3Cl$:Eu. Preferred of these are $BaMgAl_{10}O_{17}$:Eu and $Sr_{5-y}Ba_y(PO_4)_3Cl$:Eu (0<y<5), which have high emission efficiency and a broad emission band. For enhancing the color rendering properties of the white light-emitting semiconductor device, it is effective to use a blue phosphor having a broad emission band.

In the white light-emitting semiconductor devices of the invention, a green phosphor can be advantageously used as a source of the green light component. The term "green phosphor" means a phosphor which emits light having a color that is classified as "GREEN" or "YELLOWISH GREEN" in the xy chromaticity diagram (CIE 1931) shown in FIG. 19. The kind of this green phosphor is not particularly limited. For example, known green phosphors including $Eu^{2+}$, $Ce^{3+}$, or the like as an activator can be advantageously used. Suitable green phosphors employing $Eu^{2+}$ as an activator are green phosphors including crystals containing an alkaline earth silicate, alkaline earth silicate nitride, or Sialon as a base. This kind of green phosphor can usually be excited using an ultraviolet to blue light-emitting semiconductor element. Examples of the green phosphors employing crystals of an alkaline earth silicate as a base include $(Ba, Ca, Sr, Mg)_2SiO_4$:Eu and $(Ba, Sr, Ca)_2(Mg, Zn)Si_2O_7$:Eu. Examples of the green phosphors employing crystals of an alkaline earth silicate nitride as a base include $(Ba, Ca, Sr)_3Si_6O_{12}N_2$:Eu, $(Ba, Ca, Sr)_3Si_6O_9N_4$:Eu, and $(Ca, Sr, Ba)Si_2O_2N_2$:Eu.

Examples of the green phosphors employing Sialon crystals as a base include β-Sialon:Eu, $Sr_3Si_{13}Al_3O_2N_{21}$:Eu, and $Sr_5Al_5Si_{21}O_2N_{35}$:Eu. The $Sr_3Si_{13}Al_3O_2N_{21}$:Eu is disclosed in International Publication No. 2007-105631, pamphlet, and the $Sr_5Al_5Si_{21}O_2N_{35}$:Eu is disclosed in International Publication No. 2009-072043, pamphlet. Suitable green phosphors employing $Ce^{3+}$ as an activator include green phosphors including crystals of a garnet-type oxide as a base, such as, for example, $Ca_3(Sc, Mg)_2Si_3O_{12}$:Ce, and green phosphors including crystals of an alkaline earth metal scandate as a base, such as, for example, $CaSc_2O_4$:Ce. This kind of green phosphor is suitable for use in the case where a blue light-emitting semiconductor element is used as an excitation source.

The green phosphors shown above as suitable examples have satisfactory durability as compared with sulfide-based green phosphors such as ZnS:Cu,Al. In particular, the green phosphors in which the base crystals are an alkaline earth silicate nitride or Sialon have an advantage that the covalent nature of interatomic bonds in the base crystals is high because nitrogen is contained and, hence, these phosphors show highly excellent durability and heat resistance. Meanwhile, use of a phosphor including crystals of a sulfur-containing compound as a base is not recommended regardless of whether the phosphor is a green phosphor or not. This is because there are cases where the sulfur which is liberated even in a slight amount from the base crystals reacts with metals contained in the light-emitting semiconductor element, package, encapsulating material, etc., resulting in generation of a black substance.

In the light-emitting semiconductor devices of the invention, a red phosphor, in particular, a red phosphor which has an emission band having a full width at half maximum of 80 nm or more, can be advantageously used as a source of the red light component. Red phosphors of all kinds which have such emission characteristics can be used. However, suitable examples thereof include red phosphors each composed of $Eu^{2+}$ as an activator and crystals containing an alkaline earth siliconitride, alkaline earth silicate nitride, α-Sialon, or alkaline earth silicate as a base. This kind of red phosphor can usually be excited using an ultraviolet to blue light-emitting semiconductor element. Examples of the red phosphors employing crystals of an alkaline earth siliconitride as a base include $(Ca, Sr, Ba)AlSiN_3$:Eu, $(Ca, Sr, Ba)_2Si_5N_8$:Eu, and $SrAlSi_4N_7$:Eu. The $SrAlSi_4N_7$:Eu is a red phosphor disclosed in, for example, JP-A-2008-150549. Examples of the red phosphors employing crystals of an alkaline earth silicate nitride as a base include $(CaAlSiN_3)_{1-x}(Si_{(3n+2)/4}N_nO)_x$:Eu. Examples of the red phosphors employing crystals of an alkaline earth silicate as a base include $(Sr, Ba)_3SiO_5$:Eu. As in the case of the green phosphors, the red phosphors in which the base crystals contain nitrogen have highly excellent durability and heat resistance. Of these, $(Ca, Sr, Ba)AlSiN_3$:Eu and $(CaAlSiN_3)_{1-x}(Si_{(3n+2)/4}N_nO)_x$:Eu can be especially advantageously used because these two kinds of red phosphors have a high luminescent efficiency.

Figure 19:
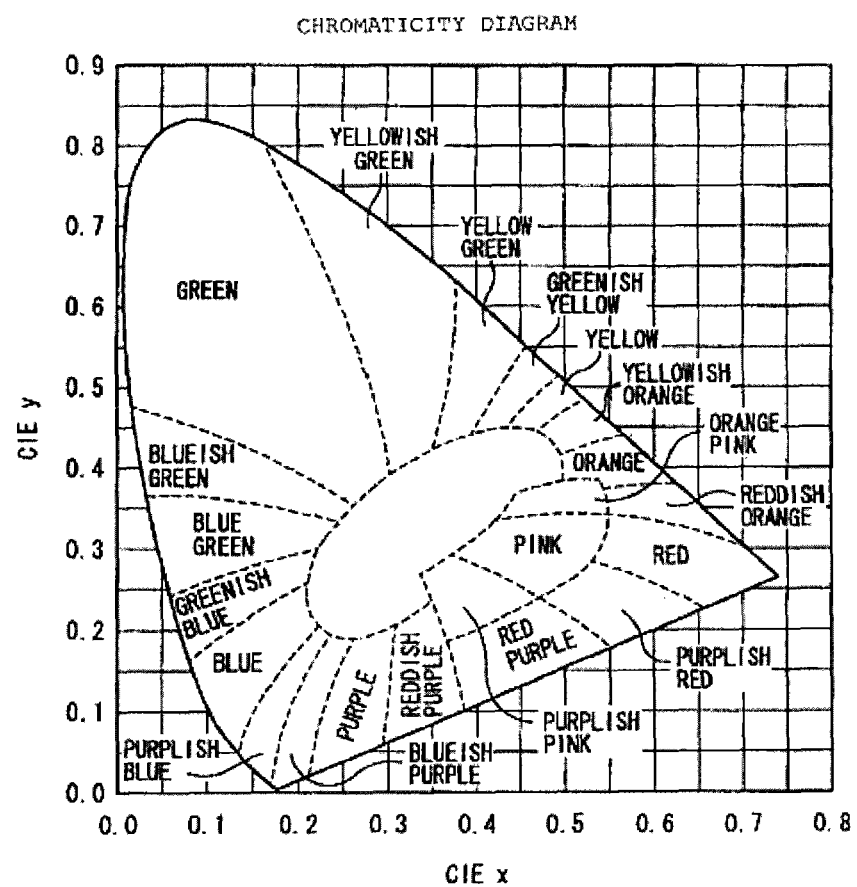
FIG. 19 shows a chromaticity diagram (CIE 1931).

The term "red phosphor" in the invention means a phosphor which emits light having a color that is classified as "RED", "REDDISH ORANGE", or "ORANGE" in the xy chromaticity diagram (CIE 1931) shown in FIG. 19. Most of such phosphors have an emission peak wavelength in the range of 590-700 nm.

In the white light-emitting semiconductor devices of the invention, a yellow phosphor can be used as part of sources of the green light component or red light component. The term "yellow phosphor" means a phosphor which emits light having a color that is classified as "YELLOW GREEN", "GREENISH YELLOW", "YELLOW", or "YELLOWISH ORANGE" in the xy chromaticity diagram (CIE 1931) shown in FIG. 19. Preferred yellow phosphors include phosphors each composed of $Ce^{3+}$ as an activator and crystals of a garnet-type oxide as a base, such as, for example, $(Y, Gd)_3Al_5O_{12}:Ce$ and $Tb_3Al_5O_{12}:Ce$. Other preferred yellow phosphors include phosphors each composed of $Ce^{3+}$ as an activator and crystals of a lanthanum siliconitride as a base, such as, for example, $La_3Si_6N_{11}:Ce$ and $Ca_{1.5x}La_{3-x}Si_6N_{11}:Ce$. Although suitable for use in the case where a blue light-emitting semiconductor element is used as an excitation source, this kind of yellow phosphor can be excited also with the light emitted by a blue phosphor.

The white light-emitting semiconductor devices of the invention are intended to emit light suitable for white illumination, that is, light which has a color having deviations Duv from the black-body radiation locus in the range of −20 to +20, preferably in the range of −6.0 to +6.0. It is a matter of course that the color of outputted light can be set by regulating an intensity balance among the light components constituting the outputted light. In an embodiment equipped with a white light-emitting unit, techniques employed in known white light-emitting devices (e.g., white LEDs) based on a combination of a light-emitting semiconductor element and a phosphor can be suitably used to set the correlated color temperature of the white light emitted by the white light-emitting unit.

The present inventors found that a white light-emitting semiconductor device having satisfactory reproducibility of bright red is obtained when the following two requirements are satisfied. The first requirement is that the light outputted by the light-emitting device should have a maximum wavelength in the range of 615-645 nm. The second requirement is that an intensity at a wavelength of 580 nm of the spectrum of the light outputted by the light-emitting device which has been normalized with respect to luminous flux should have, should be 80-100% of the intensity at a wavelength of 580 nm of the spectrum of standard light for color rendering evaluation which has been normalized with respect to luminous flux.

It is surprising that even when the maximum wavelength which is possessed by the spectrum of the outputted light in the red spectral region (590-780 nm) is shorter than 630 nm, the special color rendering index R9 of the white light-emitting semiconductor device is improved to a considerable degree by making the light-emitting device satisfy the second requirement. This fact indicates that the Stokes shift loss of a light-emitting device can be reduced without sacrificing reproducibility of bright red.

Meanwhile, there are cases where a white light-emitting semiconductor device which outputs light having a spectrum that contains a deep-red component in a large amount but which does not satisfy the second requirement has an exceedingly low value of special color rendering index R9. The inventors ascertained this phenomenon through experimental production of a white LED employing red phosphor $CaAlSiN_3:Eu$ having an emission peak wavelength of about 660 nm. It seems that this fact has conventionally been unknown even to persons skilled in the art and is a new finding.

In the following explanations, the proportion of the intensity (I1) at wavelength 580 nm of the spectrum of light outputted by a light-emitting device which has been normalized with respect to luminous flux to the intensity (I2) at wavelength 580 nm of the spectrum of standard light for color rendering evaluation which has been normalized with respect to luminous flux (I1/I2) is often called "580-nm intensity ratio".

With respect to the second requirement, a preferred 580-nm intensity ratio varies depending on the wavelength range where a maximum wavelength according to the first requirement is present. When the spectrum of outputted light has a maximum wavelength in the range of 615 nm to 630 nm, excluding 630 nm, then the 580-nm intensity ratio is preferably 85-100%, more preferably 85-95%. On the other hand, when the spectrum of outputted light has a maximum wavelength in the range of 630-645 nm, then the 580-nm intensity ratio is preferably 90-100%.

The term "standard light for color rendering evaluation" used in the second requirement means standard light as provided for in Japan Industrial Standards JIS Z8726:1990, which prescribes for a method for evaluating the color rendering properties of light sources. When a white light-emitting semiconductor device as a sample light source has a correlated color temperature lower than 5,000K, then the standard light is light from a full radiator. When a white light-emitting semiconductor device has a correlated color temperature of 5,000K or higher, the standard light is CIE daylight. The definition of full radiator and CIE daylight is in accordance with JIS Z8720:2000 (corresponding international standard, ISO/CIE 10526:1991).

The term "spectrum of light which has been normalized with respect to luminous flux" used in the second requirement means a spectrum (spectral radiant flux $\Phi_e$ in the following mathematical expression (1)) which has been normalized so that the luminous flux $\Phi$ determined by the following mathematical expression (1) is 1 (unity).

[Math. 1]

$$\Phi = K_m \int_{380}^{780} V_\lambda \Phi_e d\lambda \tag{1}$$

In mathematical expression (1),
$\Phi$ is luminous flux [lm],
$K_m$ is maximum spectral luminous efficiency [lm/W],
$V_\lambda$ is spectral luminous efficiency function for photopic vision,
$\Phi_e$ is spectral radiant flux [W/nm], and
$\lambda$ is wavelength [nm].

For obtaining a white light-emitting semiconductor device which satisfies the first requirement, a red phosphor which has an emission band having a full width at half maximum of 80 nm or more and has an emission peak wavelength of 625 nm or longer may be used as a source of the red light component. In the case where only one red phosphor is to be used, it is preferred to employ a red phosphor which has an emission peak wavelength in the range of 625-655 nm. In the case where a plurality of red phosphors are to be used, it is possible to select at least one from red phosphors having an emission peak wavelength shorter than $\lambda_1$ and to select another at least one from red phosphors having an emission peak wavelength not shorter than $\lambda_1$. Symbol $\lambda_1$ represents any wavelength in the range of 625-655 nm. All of the plurality of red phosphors can be selected from red phosphors having an emission peak wavelength in the range of 625-655 nm. In one example, all of the plurality of red phosphors may be selected from red phosphors having an emission peak wavelength of 630 m or longer.

It is desirable that a phosphor for use as a source of the green light component and a phosphor for use as a source of the red light component should be suitably selected in order that the second requirement be satisfied. For example, when one or more green phosphors and one or more red phosphors are used as the former and latter sources, respectively, and when all these phosphors each have an emission spectrum in which the relative intensity at a wavelength of 580 nm (the relative intensity at wavelength 580 nm of the emission spectrum of each phosphor, with the intensity at the peak wavelength being taken as 1; this relative intensity is hereinafter referred to also as "580-nm relative intensity") is less than 0.3, then there is a high possibility that the light-emitting device might have a 580-nm intensity ratio lower than 80%. Conversely, when both the green phosphors and the red phosphors used each have a 580-nm relative intensity higher than 0.5, then there is a high possibility that the light-emitting device might have a 580-nm intensity ratio exceeding 100%.

A suitable and simple method is to use, in combination, a plurality of red phosphors differing in 580-nm relative intensity. The second requirement can be thereby satisfied. For example, it is assumed that use of a red phosphor (red phosphor 1) as the only red phosphor results in a white light-emitting semiconductor device which has a satisfactory value of color rendering index Ra (e.g., 85) but which has a low value of special color rendering index R9 (e.g., below 60). This white light-emitting semiconductor device is examined for 580-nm intensity ratio. If the 580-nm intensity ratio thereof is greater than 100%, this 580-nm intensity ratio can be reduced to 100% or less by using, in addition to the red phosphor 1, a red phosphor (red phosphor 2) which has a lower 580-nm relative intensity than the red phosphor 1. Conversely, if the 580-nm intensity ratio of the white light-emitting semiconductor device obtained using the red phosphor 1 as the only red phosphor is less than 80%, a red phosphor (red phosphor 3) having a higher 580-nm relative intensity than the red phosphor 1 may be additionally used besides the red phosphor 1. The larger the difference in 580-nm relative intensity between the red phosphor 1 and each of the red phosphor 2 and the red phosphor 3, the larger the change in 580-nm intensity ratio which the white light-emitting device undergoes as a result of additional use of a small amount of the red phosphor 2 or red phosphor 3. Consequently, the difference in 580-nm relative intensity is preferably 0.2 or more, more preferably 0.3 or more.

In the example shown above, in the case where the red phosphor 2 is additionally used, it is preferred that the red phosphor 2 should have a longer emission peak wavelength than the red phosphor 1. Additional use of such red phosphor 2 not only reduces the 580-nm intensity ratio of the white light-emitting device but also increases the maximum wavelength possessed in the red spectral region (590-780 nm) by the spectrum of the light outputted by the light-emitting device. There is a tendency that the longer the maximum wavelength, the higher the 580-nm intensity ratio which brings about a maximum value of R9. Consequently, this red phosphor 2 imparts a high R9-improving effect when additionally used even in a small amount. Namely, reproducibility regarding bright red can be improved while minimizing various influences caused by additional use of the red phosphor 2.

Even when used alone, $Sr_xCa_{1-x}AlSiN_3$:Eu (0<x<1) and $Ca_{1-x}Al_{1-x}Si_{1+x}N_{3-x}O_x$:Eu, among red phosphors, give a white light-emitting semiconductor device having satisfactory values of color rendering index Ra and special color rendering index R9. However, by using either of the two red phosphors in combination with a red phosphor which has a longer emission peak wavelength and has a lower 580-nm relative intensity (e.g., CaAlSiN$_3$:Eu), a white light-emitting device having a further improved value of special color rendering index R9 can be obtained. Red phosphor $SrAlSi_4N_7$:Eu, which is akin in emission spectrum to $Ca_{1-x}Al_{1-x}Si_{1+x}N_{3-x}O_x$:Eu, is expected to produce the same effect.

In order that the second requirement be satisfied, a combination of a plurality of green phosphors differing in 580-nm relative intensity or a combination of a plurality of yellow phosphors differing in 580-nm relative intensity can be used in place of using a plurality of red phosphors differing in 580-nm relative intensity in combination.

An embodiment of the white light-emitting semiconductor devices of the invention may be a light-emitting device which has first to Nth (wherein N is an integer of 2 or larger) white light-emitting units each equipped with a light-emitting semiconductor element and a wavelength conversion part, and in which the first to Nth white light-emitting units each emit primary white light and the primary white light emitted by the units is mixed together, the resultant combined light being emitted as outputted light. This light-emitting device may be one which includes a white light-emitting unit that emits first primary white light (white light-emitting unit 1) and a white light-emitting unit that emits second primary white light (white light-emitting unit 2), and in which an intensity at a wavelength of 580 nm of the spectrum of the first primary white light which has been normalized with respect to luminous flux is higher than an intensity at a wavelength of 580 nm of the spectrum of standard light for color rendering evaluation which has been normalized with respect to luminous flux, and an intensity at a wavelength of 580 nm of the spectrum of the second primary white light which has been normalized with respect to luminous flux is lower than an intensity at a wavelength of 580 nm of the spectrum of standard light for color rendering evaluation which has been normalized with respect to luminous flux. In this case, the electric power to be applied to the white light-emitting unit 1 and the electric power to be applied to the white light-emitting unit 2 are controlled to regulate the proportion of the first primary white light and the proportion of the second primary white light in the light outputted by the light-emitting device. Thus, a state in which the light-emitting device satisfies the second requirement can be attained.

In order that such control of the R9 of a white light-emitting device, which is based on control of the proportions of the electric power to be applied to two white light-emitting units, might be rendered possible, a red phosphor and another red phosphor which differ from each other in 580-nm relative intensity can be used for the white light-emitting unit 1 and the white light-emitting unit 2, respectively. In this embodiment, by reducing the difference in reciprocal correlated color temperature between the first primary white light and the second primary white light, the light outputted by the white light-emitting semiconductor device can be inhibited from changing in color when the emission intensity ratio between the white light-emitting unit 1 and the white light-emitting unit 2 is changed. For this purpose, the difference in reciprocal correlated color temperature between the first primary white light and the second primary white light is regulated to preferably 50 MK$^{-1}$ or less, more preferably 25 MK$^{-1}$ or less.

The simulated white light-emitting devices S-1 shown in Table 6, which will be given later, can be regarded as a simulation example of white light-emitting semiconductor devices according to this embodiment. In the simulated white light-emitting devices S-1, white LED samples V-2 and V-7 correspond to the white light-emitting unit 1 and white light-emitting unit 2. When the intensity ratio between the primary white light emitted by V-2 and the primary white light emitted by V-7 changed from 10:0 to 0:10, then the color rendering properties of the simulated white light-emitting devices S-1 changed considerably. However, since these two kinds of primary white color had an exceedingly small chromaticity difference, the light outputted by the simulated white light-emitting devices S-1 showed substantially no change in chromaticity.

Other techniques for making the second requirement be satisfied include filtering of outputted light. This technique can be employed when it is necessary that the 580-nm intensity ratio of the outputted light should be lowered in order that the second requirement be satisfied. In this technique, light having a wavelength band including 580 nm is partly removed from the light outputted by a white light-emitting semiconductor device, by filtering with a means for filtration. The specific configuration of the filtration means is not limited, and the filtration means can be any desired light-transmitting member or light-reflecting member which has the function of partly removing light having a wavelength band including 580 nm from transmitted light or reflected light on the basis of an optical principle or absorption by a light-absorbing substance. Preferred examples of the filtration means which is a light-transmitting member include the minus filter (optical filter) disclosed in JP-A-2010-39206 and the absorption filter disclosed in JP-A-2009-251511, which contains as a light-absorbing substance a wavelength-selective absorption dye containing a cyanine compound, squarylium compound, tetraazaporphyrin compound, or the like. Examples of the filtration means which is a light-reflecting member include a light reflector in which such a wavelength-selective absorption dye has been fixed to the reflection surface and a light reflector which has a reflection surface formed from a resin containing such a wavelength-selective absorption dye.

The position in which the filtration means is to be disposed is not limited. For example, in the case of a white light-emitting semiconductor device including a white light-emitting unit, the filtration means can be disposed within the white light-emitting unit to configure the device so that light having a wavelength band including 580 nm is removed by the filtration means beforehand and the residual white light is emitted from the unit. For this purpose, the filtration means (light-transmitting member or light-reflecting member) may be disposed on the path along which the light having a wavelength band including 580 nm generated in the white light-emitting unit passes before being emitted from the unit. In one embodiment, the wavelength-selective absorption dye can be added to a transparent solid matrix (wavelength conversion part) disposed in the white light-emitting unit and containing phosphor particles dispersed therein. Namely, this embodiment has a configuration in which the filtration means has been integrated with the wavelength conversion part.

In the case of a white light-emitting semiconductor device equipped with an optical system by which the white light emitted by the white light-emitting unit is guided to the outside, the filtration means for removing part of light having a wavelength band including 580 nm from the white light can be incorporated into part of the optical system. In this case, the filtration means of a detachable or replaceable type can be incorporated into the optical system so that the amount of light to be removed by filtering can be regulated. According to this configuration, the filtration means can be made to function in accordance with the spectrum of white light emitted from the white light-emitting unit and the 580-nm intensity ratio of the light-emitting device can be optimized thereby. Namely, the special color rendering index R9 of the light-emitting device can be maximized.

In the case of a white light-emitting semiconductor device which is equipped with a plurality of light-emitting units and by which combined light obtained by mixing the multiple kinds of light respectively emitted by the plurality of light-emitting units is outputted, light having a wavelength band including 580 nm may be removed using a general short-pass filter or long-pas filter from the light emitted by at least one light-emitting unit. Thus, the 580-nm intensity ratio can be lowered. Illustratively stated, in the case of a white light-emitting semiconductor device equipped with a blue light-emitting unit, green light-emitting unit, and red light-emitting unit, a short-pass filter is used to remove a longer-wavelength-side wavelength component having wavelengths including 580 nm from the light emitted by the green light-emitting unit. Alternatively, a long-pass filter is used to remove a shorter-wavelength-side wavelength component having wavelengths including 580 nm from the light emitted by the red light-emitting unit. Thus, the 580-nm intensity ratio can be reduced.

The white light-emitting semiconductor devices of the invention should not be construed as being limited to light-emitting devices capable of outputting white light only, and may further have the function of generating light other than white light. The white light-emitting semiconductor devices of the invention may be white light-emitting devices capable of being changed in color temperature, that is, white light-emitting devices which are capable of outputting white light having various color temperatures. Furthermore, the white light-emitting semiconductor devices of the invention may be white light-emitting devices in which the color rendering properties can be changed or regulated by lighting mode switching.

<Experimental Results>

The results of experiments (including simulations) made by the present inventors are described below. The finding that the reproducibility regarding bright red of a white light-emitting semiconductor device is improved when the first requirement and second requirement described above are satisfied was obtained through the experiments. Table 1 is a list of the phosphors used in the experiments.

TABLE 1

| | | | Properties of emission spectrum | | |
| --- | --- | --- | --- | --- | --- |
| Name | Classification | General formula | Emission peak wavelength [nm] (excitation wavelength [nm]) | Full width at half maximum [nm] | Relative intensity at 580 nm |
| BAM | blue fluorescent substance | $BaMgAl_{10}O_{17}:Eu$ | 455 (400) | 52 | — |
| SCA | blue fluorescent substance | $Sr_5(PO_4)_3Cl:Eu$ | 450 (405) | 28 | — |

TABLE 1-continued

| Name | Classification | General formula | Emission peak wavelength [nm] (excitation wavelength [nm]) | Full width at half maximum [nm] | Relative intensity at 580 nm |
|---|---|---|---|---|---|
| SBCA | blue fluorescent substance | $Sr_{5-y}Ba_y(PO_4)_3Cl:Eu$ | 453 (410) | 62 | — |
| BSS | green fluorescent substance | $(Ba,Ca,Sr,Mg)_2SiO_4:Eu$ | 529 (405)<br>529 (450) | 66<br>67 | 0.32<br>0.33 |
| BSON | green fluorescent substance | $(Ba,Ca,Sr)_3Si_6O_{12}N_2:Eu$ | 535 (405) | 71 | 0.45 |
| β-SiAlON | green fluorescent substance | $Si_{6-z}Al_zN_{8-z}O_z:Eu$ | 542 (400) | 56 | 0.41 |
| CSMS | green fluorescent substance | $Ca_3(Sc,Mg)_2Si_3O_{12}:Ce$ | 516 (455) | 107 | 0.69 |
| CSO | green fluorescent substance | $CaSc_2O_4:Ce$ | 520 (455) | 101 | 0.65 |
| YAG | yellow fluorescent substance | $Y_3Al_5O_{12}:Ce$ | 559 (465) | 113 | 0.93 |
| SBS | red fluorescent substance | $(Sr,Ba)_3SiO_5:Eu$ | 596 (455)<br>592 (402) | 80<br>84 | 0.88<br>0.92 |
| SCASN | red fluorescent substance | $Sr_xCa_{1-x}AlSiN_3:Eu$ | 626 (405)<br>628 (450) | 88<br>87 | 0.35<br>0.31 |
| CASON-1 | red fluorescent substance | $Ca_{1-x}Al_{1-x}Si_{1+x}N_{3-x}O_x:Eu$ | 643 (405)<br>643 (450) | 116<br>106 | 0.46<br>0.35 |
| CASON-2 | red fluorescent substance | $Ca_{1-x}Al_{1-x}Si_{1+x}N_{3-x}O_x:Eu$ | 638 (400)<br>641 (450) | 127<br>111 | 0.57<br>0.43 |
| CASN-1 | red fluorescent substance | $CaAlSiN_3:Eu$ | 659 (400) | 90 | 0.05 |
| CASN-2 | red fluorescent substance | $CaAlSiN_3:Eu$ | 648 (455) | 88 | 0.13 |

Table 1 shows the name used in the description, classification by the color of emitted light, general formula, and properties of emission spectrum, with respect to each phosphor. The properties of emission spectrum shown are the peak wavelength (emission peak wavelength) and full width at half maximum of the main emission band and "relative intensity at 580 nm". The values of these properties each was determined through a measurement which was made when the phosphor was excited at the wavelength shown in the parentheses in the column Emission peak wavelength. The "relative intensity at 580 nm" has the same meaning as the 580-nm relative intensity described above, and is the value of the intensity at wavelength 580 nm of the emission spectrum relative to the intensity at the emission peak wavelength (emission peak intensity) of the emission spectrum, which is taken as 1.

Emission spectra of the phosphors were examined by an ordinary method in use in this field, except for the properties of the emission spectrum of SBS which was obtained at an excitation wavelength of 402 nm. These properties are based on the results of an examination of an emission spectrum of a red light-emitting unit. This red light-emitting unit was produced by mounting one InGaN-based light-emitting diode chip having an emission peak wavelength of 402 nm in a 3528 SMD type PPA resin package and encapsulating the package with a silicone resin composition to which powdery SBS had been added. The light-emitting diode chip had a size of 350 μm square, and the current which was applied to the red light-emitting unit during emission spectrum examination was 20 mA.

CASON-1 and CASON-2, which each are a red phosphor represented by the general formula $Ca_{1-x}Al_{1-x}Si_{1+x}N_{3-x}O_x$:Eu, differ in emission characteristics probably because of a difference in the value of x, etc. The base of $Ca_{1-x}Al_{1-x}Si_{1+x}N_{3-x}O_x$:Eu is a solid solution between $CaAlSiN_3$ and $Si_2N_2O$, and is sometimes expressed by $(CaAlSiN_3)_{1-x}$ $(Si_2N_2O)_x$. There are cases where these phosphors are often represented by the general formula $CaAlSi(N, O)_3$:Eu.

CASN-1 and CASN-2, which each are a red phosphor represented by the general formula $CaAlSiN_3$:Eu, differ in emission characteristics. The fact that phosphors represented by the same general formula (phosphors which are equal in the basic structure of the base) show different emission characteristics by the influence of a factor, such as, for example, activator concentration, impurity concentration, or difference of base composition from the general formula, and that phosphors having various emission characteristics according to requests from the market are being produced while utilizing that fact are well known in this technical field.

Lists of white LED samples produced using the phosphors given in Table 1 are shown in Table 2 and Table 3. In the eleven kinds of samples ranging from V-1 to V-11 shown in Table 2, a purple light-emitting diode element having an emission peak wavelength of about 405 nm is used as an excitation source for the phosphors. On the other hand, in the ten kinds of samples ranging from B-1 to B-10 shown in Table 3, a blue light-emitting diode element having an emission peak wavelength of about 450 nm is used as a source of blue light and as an excitation source for the phosphors.

White LED samples V-1 to V-11 and B-1 to B-10 each were produced by mounting one InGaN-based light-emitting diode element (chip) which was 350 μm square in a 3528 SMD type PPA resin package and encapsulating the package with a silicone resin composition to which powdery phosphors had been added. Table 2 and Table 3 show the names of the phosphors used in each sample and the proportion (concentration) of each phosphor in the silicone resin composition used for encapsulating the light-emitting diode element. For example, sample V-1 has a structure obtained by encapsulating the purple light-emitting diode element with a silicone resin composition containing blue phosphor BAM, green phosphor BSS, and red phosphor CASON-1 in concentrations of 9.0 wt %, 1.2 wt %, and 4.3 wt %, respectively.

In Table 4 and Table 5 are shown the emission characteristics of each of white LED samples V-1 to V-11 and B-1 to B-10. The values of correlated color temperature, Duv, Ra, R9, maximum wavelength in red spectral region, and 580-nm intensity ratio each are based on the emission spectrum obtained when a current of 20 mA was applied to one white LED sample to cause the sample to emit light.

TABLE 2

| Sample name | LED element | Name of phosphor | | | Proportions of phosphors [wt %] | | |
|---|---|---|---|---|---|---|---|
| | | Blue | Green | Red | Blue | Green | Red |
| V-1 | purple | BAM | BSS | CASON-1 | 9.0 | 1.2 | 4.3 |
| V-2 | purple | BAM | BSS | CASON-2 | 8.8 | 1.2 | 4.6 |
| V-3 | purple | BAM | BSS | CASON-2, CASN-1 | 9.0 | 1.2 | 4.0 (CASON-2), 0.2 (CASN-1) |
| V-4 | purple | BAM | BSS | CASON-2, CASN-1 | 9.0 | 1.4 | 3.8 (CASON-2), 0.4 (CASN-1) |
| V-5 | purple | BAM | BSS | SBS | 8.2 | 0.8 | 7.0 |
| V-6 | purple | BAM | BSS | SCASN | 15.4 | 2.0 | 1.7 |
| V-7 | purple | BAM | BSS | CASN-1 | 12.1 | 2.6 | 1.4 |
| V-8 | purple | SCA | BSS | CASON-1 | 6.6 | 2.6 | 5.4 |
| V-9 | purple | SCA | BSS | CASON-2 | 6.6 | 2.4 | 5.6 |
| V-10 | purple | SBCA | β-SiAlON | CASN-1 | 3.5 | 2.2 | 4.8 |
| V-11 | purple | SBCA | BSON | CASN-1 | 3.5 | 1.7 | 4.7 |

TABLE 3

| Sample name | LED element | Kind of phosphor | | | Proportions of phosphors [wt %] | | |
|---|---|---|---|---|---|---|---|
| | | Green | Yellow | Red | Green | Yellow | Red |
| B-1 | blue | BSS | — | CASON-1 | 6.5 | — | 6.8 |
| B-2 | blue | BSS | — | CASON-2 | 6.5 | — | 8.0 |
| B-3 | blue | CSMS | — | SCASN | 7.9 | — | 2.1 |
| B-4 | blue | CSO | — | SCASN | 7.9 | — | 2.1 |
| B-5 | blue | — | YAG | CASN-2 | — | 8.4 | 3.3 |
| B-6 | blue | CSMS | — | CASN-2 | 10.4 | — | 4.1 |
| B-7 | blue | CSMS | YAG | CASN-2 | 5.2 | 4.2 | 3.7 |
| B-8 | blue | CSMS | YAG | CASN-2 | 9.3 | 1.1 | 3.9 |
| B-9 | blue | BSS | — | CASON-2 | 5.4 | — | 4.0 |
| B-10 | blue | CSO | — | SCASN | 5.9 | — | 0.8 |

TABLE 4

| Sample name | LED element | Kind of phosphor | | | Correlated color temperature [K] | Duv | Ra | R9 | Maximum wavelength in red spectral region [nm] | 580-nm intensity ratio [%] |
|---|---|---|---|---|---|---|---|---|---|---|
| | | Blue | Green | Red | | | | | | |
| V-1 | purple | BAM | BSS | CASON-1 | 2987 | −3.3 | 97 | 88 | 631 | 97 |
| V-2 | purple | BAM | BSS | CASON-2 | 2987 | −3.1 | 96 | 76 | 624 | 101 |
| V-3 | purple | BAM | BSS | CASON-2, CASN-1 | 2951 | −4.2 | 97 | 98 | 635 | 95 |
| V-4 | purple | BAM | BSS | CASON-2, CASN-1 | 2983 | −2.8 | 96 | 93 | 636 | 92 |
| V-5 | purple | BAM | BSS | SBS | 2840 | −5.1 | 65 | −60 | 591 | 140 |
| V-6 | purple | BAM | BSS | SCASN | 2725 | −5.0 | 92 | 79 | 620 | 93 |
| V-7 | purple | BAM | BSS | CASN-1 | 3004 | −2.5 | 69 | −21 | 652 | 62 |
| V-8 | purple | SCA | BSS | CASON-1 | 2990 | −3.5 | 94 | 88 | 635 | 95 |
| V-9 | purple | SCA | BSS | CASON-2 | 3049 | −1.7 | 92 | 73 | 629 | 99 |
| V-10 | purple | SBCA | β-SiAlON | CASON-1 | 3030 | −1.7 | 95 | 85 | 634 | 96 |
| V-11 | purple | SBCA | BSON | CASON-1 | 3085 | −1.7 | 96 | 84 | 633 | 98 |

TABLE 5

| Sample name | LED element | Kind of phosphor | | | Correlated color temperature [K] | Duv | Ra | R9 | Maximum wavelength in red spectral region [nm] | 580-nm intensity ratio [%] |
|---|---|---|---|---|---|---|---|---|---|---|
| | | Green | Yellow | Red | | | | | | |
| B-1 | blue | BSS | — | CASON-1 | 2972 | −2.3 | 97 | 96 | 636 | 91 |
| B-2 | blue | BSS | — | CASON-2 | 3036 | −0.6 | 96 | 90 | 631 | 94 |
| B-3 | blue | CSMS | — | SCASN | 3030 | −1.8 | 89 | 43 | 616 | 109 |
| B-4 | blue | CSO | — | SCASN | 2903 | −3.4 | 88 | 37 | 611 | 110 |
| B-5 | blue | — | YAG | CASN-2 | 2659 | −0.7 | 83 | 40 | 621 | 107 |
| B-6 | blue | CSMS | — | CASN-2 | 2666 | −0.3 | 95 | 93 | 637 | 92 |
| B-7 | blue | CSMS | YAG | CASN-2 | 2684 | −0.4 | 91 | 67 | 633 | 101 |
| B-8 | blue | CSMS | YAG | CASN-2 | 2687 | −0.8 | 98 | 97 | 635 | 93 |
| B-9 | blue | BSS | — | CASON-2 | 6488 | 1.7 | 94 | 95 | 626 | 92 |
| B-10 | blue | CSO | — | SCASN | 6420 | 3.0 | 90 | 45 | — | 108 |

Attention is directed to white LED sample V-1, in which CASON-1 was used as a red phosphor, and white LED sample V-2, in which CASON-2 was used as a red phosphor. As shown in Table 4, the color rendering indexes Ra of the former and the latter are as exceedingly high as 97 and 96, respectively. With respect to special color rendering index R9 also, V-1 has an R9 of 88 and V-2 has an R9 of 76, these values each being satisfactory. However, in contrast to Ra, there is a relatively large difference in R9 between V-1 and V-2.

In FIG. 1, the emission spectra of white LED samples V-1 and V-2 which each have been normalized with respect to the spectral intensity (peak intensity in red spectral region) observed at the maximum wavelength (631 nm for V-1; 624 nm for V-2) present in the red spectral region (wavelength, 590-780 nm) are shown so as to overlap each other. It can be seen from FIG. 1 that the spectral intensity of V-2 exceeds the spectral intensity of V-1 in the wavelength range including 580 nm as the center and having a width of about 100 nm.

Figure 2:
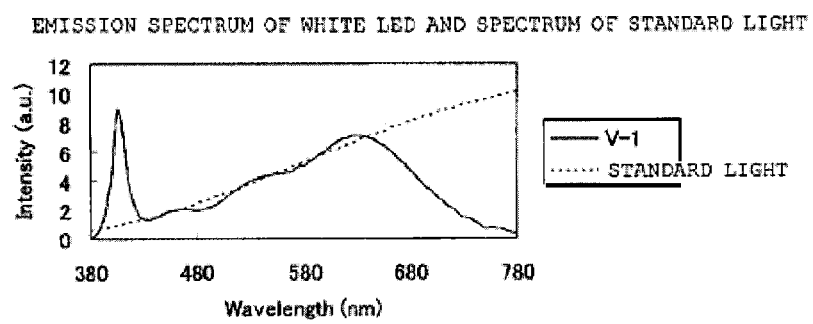
FIG. 2 shows an emission spectrum of a white LED and a spectrum of standard light for color rendering evaluation.

In FIG. 2, the emission spectrum of white LED sample V-1 and the spectrum of standard light for color rendering evaluation (light from a full radiator having the same correlated color temperature as V-1) are shown so as to overlap each other. The intensities of the two spectra have been normalized so that the spectra have the same value of luminous flux determined by mathematical expression (1).

Figure 3:
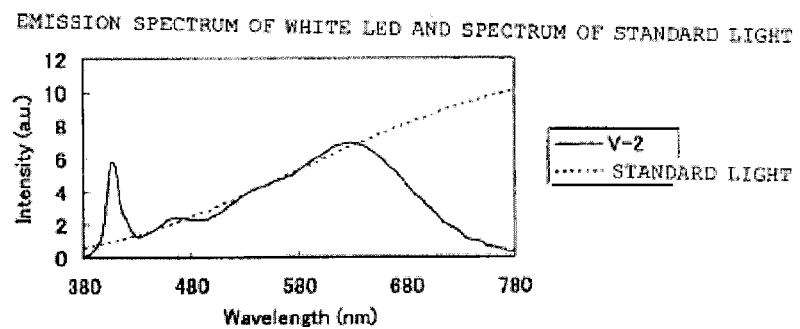
FIG. 3 shows an emission spectrum of a white LED and a spectrum of standard light for color rendering evaluation.

In FIG. 3, the emission spectrum of white LED sample V-2 and the spectrum of standard light for color rendering evaluation (light from a full radiator having the same correlated color temperature as V-2) are shown so as to overlap each other. The intensities of the two spectra have been normalized so that the spectra have the same value of luminous flux determined by mathematical expression (1).

A comparison between FIG. 2 and FIG. 3 shows the following. With respect to the degree of deviation of the emission spectrum of each white LED sample from the spectrum of standard light for color rendering evaluation, there seems to be no large difference between V-1 and V-2 at a glance. However, when attention is directed to spectral intensity observed at a wavelength of 580 nm, it can be seen that the spectral intensity of the light emitted by V-1 is lower than the spectral intensity of the standard light (580-nm intensity ratio, 97%), whereas the spectral intensity of the light emitted by V-2 slightly exceeds the spectral intensity of standard light for color rendering evaluation (580-nm intensity ratio, 101%).

Figure 4:
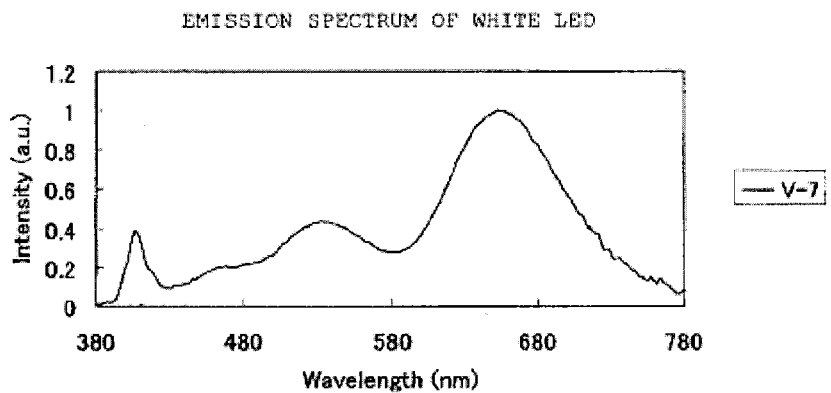
FIG. 4 shows an emission spectrum of a white LED.

Table 6 shows the results obtained by simulating the emission characteristics of an ideal white light-emitting device obtained by using white LED samples V-2 and V-7 in combination. In other words, the table shows the emission characteristics of simulated white light-emitting devices S-1 in which the spectrum of the outputted light is a combined spectrum obtained by putting the emission spectra of V-2 and V-7 together. V-7 is a white LED sample which employs CASN-1 as a source of the red light component, CASN-1 having the longest emission peak wavelength among the red phosphors used here. The emission spectrum of V-7 is shown in FIG. 4.

In the simulations shown in Table 6, the emission spectra of white LED samples V-2 and V-7 which each had been normalized with respect to luminous flux were put together in various proportions to produce combined spectra, and the chromaticity coordinate values, correlated color temperature, Duv, Ra, R9, and 580-nm intensity ratio were calculated on the basis of each combined spectrum. In Table 6, the column in which, for example, the "Proportion of emission spectrum of white LED (a) in combined spectrum" is 0.4 and the "Proportion of emission spectrum of white LED (b) in combined spectrum" is 0.6 shows the spectral characteristics of simulated white light-emitting device S-1 in which the spectrum of the outputted light is a combined spectrum obtained by putting together the emission spectrum of V-2 normalized with respect to luminous flux and the emission spectrum of V-7 normalized with respect to luminous flux, in a proportion of 4:6.

intensities of the two spectra have been normalized so that the spectra have the same value of luminous flux determined by mathematical expression (1).

Figure 6:
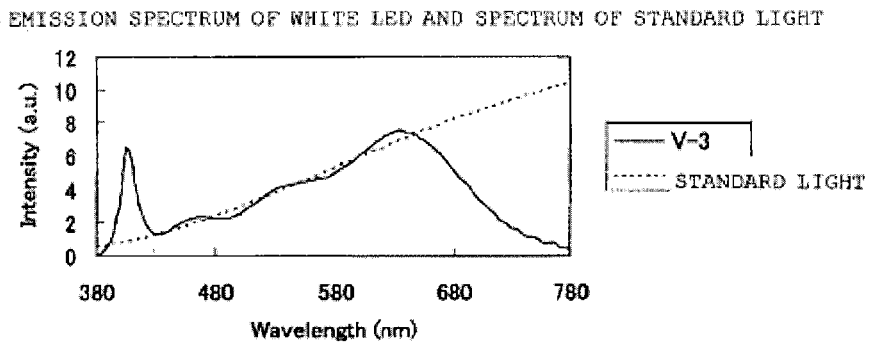
FIG. 6 shows an emission spectrum of a white LED and a spectrum of standard light for color rendering evaluation.
Figure 7:
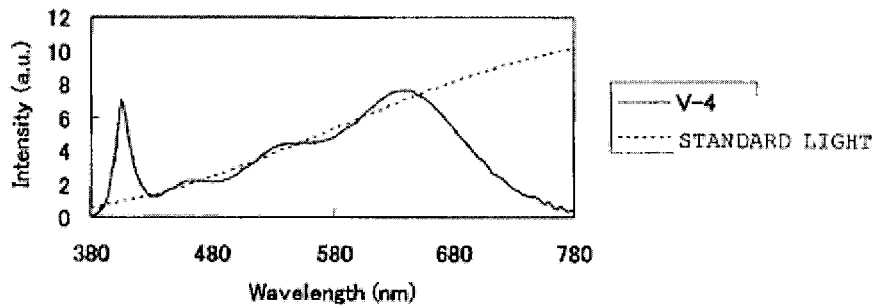
FIG. 7 shows an emission spectrum of a white LED and a spectrum of standard light for color rendering evaluation.

Meanwhile, the emission spectra of V-3 and V-4, which are white LED samples actually produced using CASON-2 and CASN-1 as red phosphors, are shown in FIG. 6 and FIG. 7, respectively. The spectrum of standard light for color rendering evaluation is also shown in each figure. In each figure, the intensities of the emission spectrum of the white LED sample and of the spectrum of the standard light have been normalized so that the spectra have the same value of luminous flux determined by mathematical expression (1).

White LED sample V-3, the emission spectrum of which is shown in FIG. 6, has highly excellent color rendering properties (Ra=97, R9=98). This sample V-3 has a 580-nm intensity ratio of 95%. White LED sample V-4, the emission spectrum of which is shown in FIG. 7, also has high color rendering properties (Ra=96, R9=93). V-4 has a 580-nm intensity ratio of 92%.

Tables 7 to 11 each show the results obtained by simulating the emission characteristics of an ideal white light-emitting device obtained by using two white LED samples in combination. In other words, each table shows the results obtained

TABLE 6

Spectral characteristics of simulated white light-emitting devices S-1
(white LED (a), V-2; white LED (b), V-7)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity coordinate values x | 0.433 | 0.433 | 0.433 | 0.433 | 0.433 | 0.433 | 0.433 | 0.433 | 0.433 | 0.433 | 0.433 |
| Chromaticity coordinate values y | 0.395 | 0.395 | 0.395 | 0.395 | 0.396 | 0.396 | 0.396 | 0.396 | 0.396 | 0.396 | 0.397 |
| Correlated color temperature [K] | 2987 | 2988 | 2989 | 2990 | 2992 | 2993 | 2995 | 2997 | 2999 | 3002 | 3004 |
| Duv | −3.1 | −3.1 | −3.1 | −3.0 | −3.0 | −2.9 | −2.9 | −2.8 | −2.7 | −2.6 | −2.5 |
| Ra | 96 | 97 | 98 | 96 | 94 | 91 | 88 | 84 | 80 | 75 | 69 |
| R9 | 76 | 85 | 95 | 94 | 82 | 69 | 55 | 39 | 21 | 1 | −21 |
| Maximum wavelength in red spectral region [nm] | 624 | 630 | 639 | 639 | 643 | 644 | 644 | 649 | 652 | 652 | 652 |
| 580-nm intensity ratio [%] | 101 | 99 | 96 | 93 | 90 | 87 | 83 | 79 | 74 | 68 | 62 |

Figure 5:
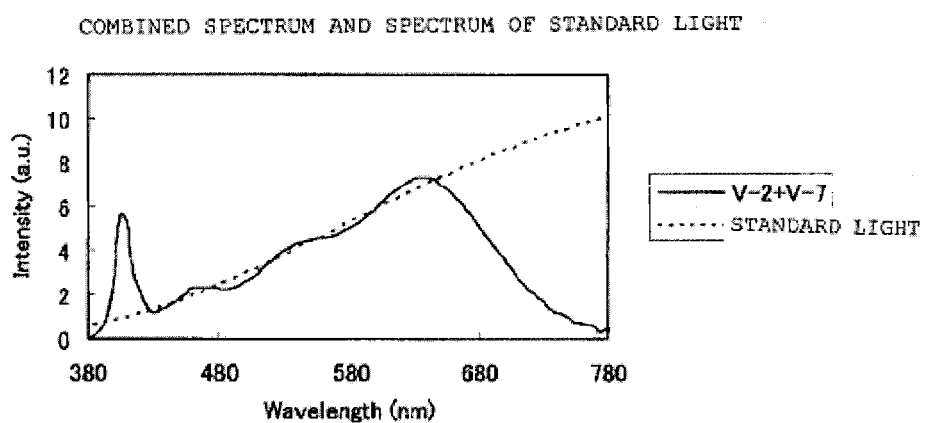
FIG. 5 shows a combined spectrum and a spectrum of standard light for color rendering evaluation.

As shown in Table 6, the Ra and R9 of simulated white light-emitting devices S-1 are maximal when the spectrum of the outputted light is a combined spectrum obtained by putting the emission spectrum of V-2 and the emission spectrum of V-7 together in a proportion of 8:2 (Ra=98, R9=95). This device has a 580-nm intensity ratio of 96%. This combined spectrum is shown in FIG. 5 together with the spectrum of standard light for color rendering evaluation. In FIG. 5, the by calculating the emission characteristics of simulated white light-emitting devices in which the spectrum of the outputted light is a combined spectrum obtained by putting the emission spectra of the two white LED samples together. In the simulations in each table, the emission spectra of two white LED samples which each had been normalized with respect to luminous flux were put together in various proportions to produce combined spectra, and the chromaticity coordinate values, correlated color temperature, Duv, Ra, R9, and 580-nm intensity ratio were calculated on the basis of each combined spectrum, as in the simulations shown in Table 6.

Figure 8:
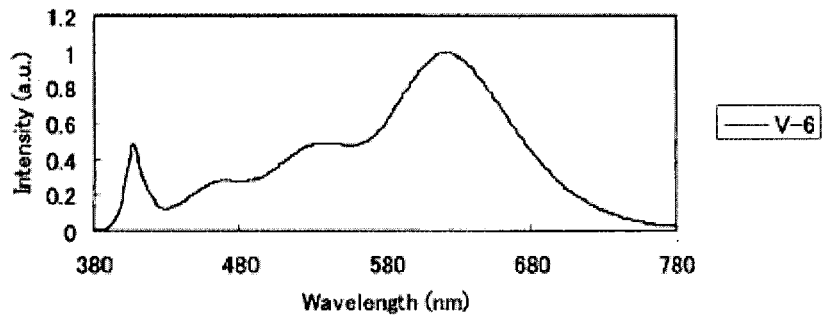
FIG. 8 shows an emission spectrum of a white LED.

In Table 7 are shown the emission characteristics of simulated white light-emitting devices S-2 in which the spectrum of the outputted light is a combined spectrum obtained by putting the emission spectra of white LED samples V-6 and V-7 together. In FIG. 8 is shown the emission spectrum of V-6.

Figure 9:
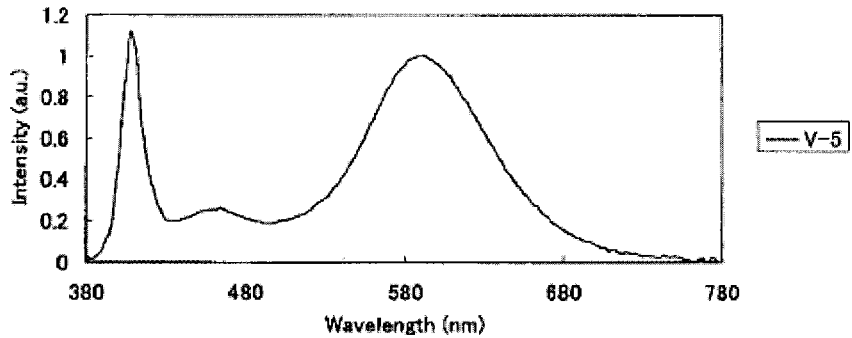
FIG. 9 shows an emission spectrum of a white LED.

According to the simulations shown in Table 7, the simulated white light-emitting device in which the spectrum of the outputted light is a combined spectrum (580-nm intensity ratio, 89%) obtained by putting the emission spectrum of V-6 and the emission spectrum of V-7 together in a proportion of 8:2 has exceedingly high reproducibility regarding bright red (R9=96) although the maximum wavelength which the spectrum of the outputted light possesses in the red spectral region is as relatively short as 627 nm.

putting the emission spectra of white LED sample V-5 and V-7 together. In FIG. 9 is shown the emission spectrum of V-5.

White LED sample V-5 itself does not have entirely satisfactory color rendering properties (Ra=65, R9=−60). The same applies to white LED sample V-7 (Ra=69, R9=−21). However, according to the simulations shown in Table 8, the simulated white light-emitting device in which the spectrum of the outputted light is a combined spectrum (580-nm intensity ratio, 102%) obtained by putting the emission spectrum of V-5 and the emission spectrum of V-7 together in a proportion of 3:7 has satisfactory color rendering properties (Ra=96, R9=87). This simulation is the only example, among all cases that have been examined so far by the inventors, in which the 580-nm intensity ratio exceeds 100% and, simultaneously therewith, the R9 exceeds 80. These results are thought to indicate a tendency that as the maximum wavelength which

TABLE 7

Spectral characteristics of simulated white light-emitting devices S-2
(white LED (a), V-6; white LED (b), V-7)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity coordinate values  x | 0.450 | 0.449 | 0.448 | 0.446 | 0.445 | 0.444 | 0.442 | 0.440 | 0.438 | 0.436 | 0.433 |
| y | 0.395 | 0.395 | 0.395 | 0.395 | 0.396 | 0.396 | 0.396 | 0.396 | 0.396 | 0.396 | 0.397 |
| Correlated color temperature [K] | 2725 | 2741 | 2758 | 2777 | 2798 | 2822 | 2849 | 2879 | 2915 | 2956 | 3004 |
| Duv | −5.0 | −4.8 | −4.7 | −4.5 | −4.4 | −4.2 | −3.9 | −3.7 | −3.4 | −3.0 | −2.5 |
| Ra | 92 | 93 | 93 | 92 | 90 | 87 | 85 | 82 | 78 | 74 | 69 |
| R9 | 79 | 87 | 96 | 92 | 81 | 69 | 55 | 39 | 22 | 2 | −21 |
| Maximum wavelength in red spectral region [nm] | 620 | 626 | 627 | 629 | 634 | 637 | 639 | 644 | 649 | 652 | 652 |
| 580-nm intensity ratio [%] | 93 | 91 | 89 | 87 | 84 | 82 | 79 | 75 | 71 | 67 | 62 |

In Table 8 are shown the emission characteristics of simulated white light-emitting devices S-3 in which the spectrum of the outputted light is a combined spectrum obtained by the spectrum of the outputted light possesses in the red spectral region increases, the 580-nm intensity ratio which brings about a maximal value of R9 increases.

TABLE 8

Spectral characteristics of simulated white light-emitting devices S-3
(white LED (a), V-5; white LED (b), V-7)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of | 0.0 | 0.1 | 0.2 | 0.3 | 0.4 | 0.5 | 0.6 | 0.7 | 0.8 | 0.9 | 1.0 |

TABLE 8-continued

Spectral characteristics of simulated
white light-emitting devices S-3
(white LED (a), V-5; white LED (b), V-7)

| white LED (b) in combined spectrum | | | | | | | | | | | |
|---|---|---|---|---|---|---|---|---|---|---|---|
| Chromaticity x | 0.441 | 0.441 | 0.440 | 0.440 | 0.439 | 0.439 | 0.438 | 0.437 | 0.436 | 0.435 | 0.433 |
| coordinate y values | 0.393 | 0.393 | 0.393 | 0.393 | 0.393 | 0.394 | 0.394 | 0.395 | 0.395 | 0.396 | 0.397 |
| Correlated color temperature [K] | 2840 | 2846 | 2854 | 2863 | 2874 | 2886 | 2901 | 2919 | 2940 | 2968 | 3004 |
| Duv | −5.1 | −5.0 | −4.9 | −4.7 | −4.6 | −4.4 | −4.1 | −3.9 | −3.5 | −3.1 | −2.5 |
| Ra | 65 | 68 | 71 | 75 | 79 | 84 | 90 | 96 | 93 | 83 | 69 |
| R9 | −60 | −46 | −30 | −12 | 7 | 30 | 56 | 87 | 77 | 33 | −21 |
| Maximum wavelength in red spectral region [nm] | 591 | 591 | 591 | 593 | 593 | 601 | 627 | 639 | 644 | 652 | 652 |
| 580-nm intensity ratio [%] | 141 | 137 | 133 | 129 | 124 | 118 | 111 | 102 | 92 | 79 | 62 |

In Table 9 are shown the emission characteristics of simulated white light-emitting devices S-4 in which the spectrum of the outputted light is a combined spectrum obtained by putting the emission spectra of white LED samples V-6 and V-1 together. V-6 and V-1 each have relatively high color rendering properties. However, as the table shows, the simulated white light-emitting devices S-4 had no substantial difference in color rendering property over the range of 9:1 to 1:9 in terms of the proportion in which the emission spectra were put together. One of the reasons therefor is thought to be the fact that the difference in 580-nm relative intensity between red phosphor SCASN, which is used in white LED sample V-6, and red phosphor CASON-1, which is used in white LED sample V-1, is small. Furthermore, CASON-1 has a longer emission peak wavelength than SCASN, whereas CASON-1 has a higher 580-nm relative intensity than SCASN. There may be a possibility that a combination of such red phosphors might produce no remarkable effect of improving color rendering properties.

TABLE 9

Spectral characteristics of simulated
white light-emitting devices S-4
(white LED (a), V-6; white LED (b), V-1)

| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
|---|---|---|---|---|---|---|---|---|---|---|---|
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity x | 0.450 | 0.448 | 0.446 | 0.445 | 0.443 | 0.441 | 0.440 | 0.438 | 0.436 | 0.435 | 0.433 |
| coordinate y values | 0.395 | 0.395 | 0.395 | 0.395 | 0.395 | 0.395 | 0.395 | 0.395 | 0.395 | 0.395 | 0.395 |
| Correlated color temperature [K] | 2725 | 2749 | 2774 | 2799 | 2825 | 2851 | 2877 | 2904 | 2931 | 2959 | 2987 |
| Duv | −5 | −4.8 | −4.7 | −4.6 | −4.4 | −4.2 | −4.1 | −3.9 | −3.7 | −3.5 | −3.3 |
| Ra | 92 | 93 | 94 | 94 | 95 | 96 | 96 | 96 | 97 | 97 | 97 |
| R9 | 79 | 80 | 81 | 82 | 82 | 83 | 84 | 85 | 86 | 87 | 88 |
| Maximum wavelength in red spectral region [nm] | 620 | 621 | 621 | 624 | 626 | 626 | 626 | 626 | 626 | 631 | 631 |
| 580-nm intensity ratio [%] | 93 | 93 | 93 | 94 | 94 | 95 | 95 | 95 | 96 | 96 | 97 |

In Table 10 are shown the emission characteristics of simulated white light-emitting devices S-5 in which the spectrum of the outputted light is a combined spectrum obtained by putting the emission spectra of white LED samples V-5 and V-1 together. In the simulated white light-emitting devices S-5, the 580-nm intensity ratio of the outputted light exceeded 100% over the range of 9:1 to 1:9 in terms of the proportion in which the emission spectrum of V-5 and the emission spectrum of V-1 were put together. When that proportion was 2:8 and 1:9, the color rendering index Ra reached 90 but the special color rendering index R9 did not reach 70.

TABLE 10

Spectral characteristics of simulated
white light-emitting devices S-5
(white LED (a), V-5; white LED (b), V-1)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity coordinate values x | 0.441 | 0.440 | 0.440 | 0.439 | 0.438 | 0.438 | 0.437 | 0.436 | 0.435 | 0.434 | 0.433 |
| Chromaticity coordinate values y | 0.393 | 0.393 | 0.393 | 0.393 | 0.393 | 0.393 | 0.394 | 0.394 | 0.394 | 0.394 | 0.395 |
| Correlated color temperature [K] | 2840 | 2850 | 2861 | 2873 | 2886 | 2899 | 2914 | 2930 | 2947 | 2966 | 2987 |
| Duv | −5.1 | −5.0 | −4.8 | −4.7 | −4.5 | −4.4 | −4.2 | −4.0 | −3.8 | −3.6 | −3.3 |
| Ra | 65 | 67 | 70 | 73 | 76 | 79 | 83 | 86 | 90 | 94 | 97 |
| R9 | −60 | −48 | −36 | −24 | −10 | 4 | 19 | 35 | 51 | 69 | 88 |
| Maximum wavelength in red spectral region [nm] | 591 | 591 | 593 | 593 | 595 | 595 | 606 | 606 | 615 | 625 | 631 |
| 580-nm intensity ratio [%] | 141 | 137 | 134 | 130 | 127 | 122 | 118 | 113 | 108 | 103 | 97 |

Figure 10:
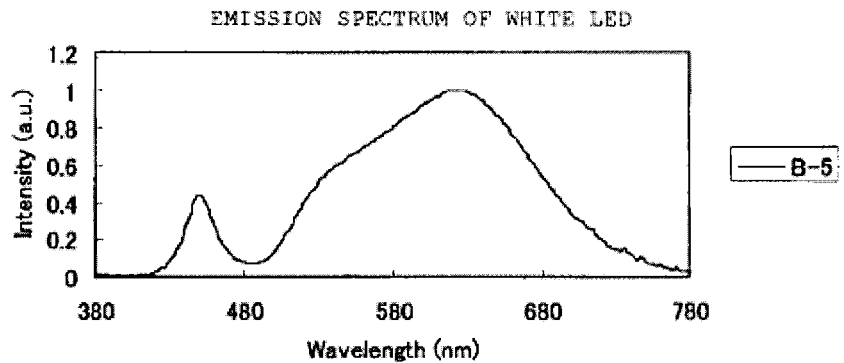
FIG. 10 shows an emission spectrum of a white LED.
Figure 11:
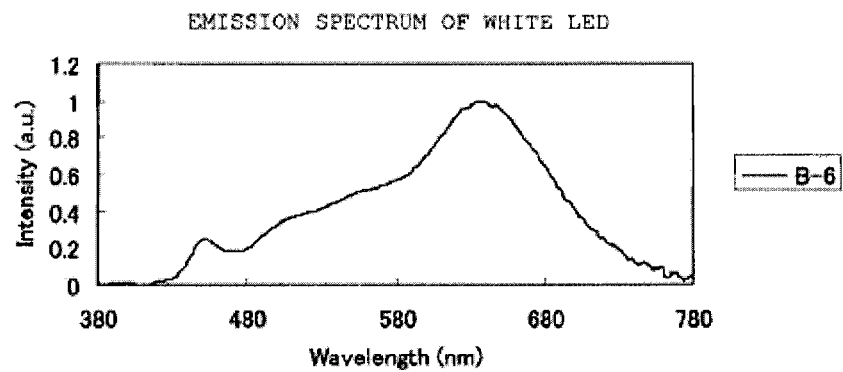
FIG. 11 shows an emission spectrum of a white LED.

In Table 11 are shown the emission characteristics of simulated white light-emitting devices S-6 in which the spectrum of the outputted light is a combined spectrum obtained by putting the emission spectra of white LED samples B-5 and B-6 together. In FIG. 10 is shown the emission spectrum of white LED sample B-5. In FIG. 11 is shown the emission spectrum of white LED sample B-6. B-5 employs a blue light-emitting diode element in combination with yellow phosphor YAG and red phosphor CASN-2, and is not equipped with a green phosphor. B-5 has a satisfactory color rendering index (Ra=83), but is inferior in reproducibility regarding bright red (R9=40). On the other hand, B-6, which employs a blue light-emitting diode element in combination with green phosphor CSMS and red phosphor CASN-2, has a high color rendering index (Ra=95) and further has excellent reproducibility regarding bright red (R9=93).

It was surprising that the Ra and R9 of the simulated white light-emitting devices S-6 were maximal when the spectrum of the outputted light was a combined spectrum obtained by putting the emission spectrum of B-5 and the emission spectrum of B-6 together in a proportion of 1:9 (Ra=98, R9=98). This device has a 580-nm intensity ratio of 94%. Also in the case where those two spectra had been put together in a proportion of 2:8 (580-nm intensity ratio, 96%), this simulated white light-emitting device S-6 had fully satisfactory values of Ra and R9 (Ra=98, R9=90). The reason why these results are surprising is that it is generally thought that white light-emitting semiconductor devices employing a yellow phosphor are inferior in color rendering property to white light-emitting semiconductor devices employing no yellow phosphor.

TABLE 11

Spectral characteristics of simulated
white light-emitting devices S-6
(white LED (a), B-5; white LED (b), B-6)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity coordinate values x | 0.462 | 0.462 | 0.462 | 0.462 | 0.462 | 0.462 | 0.462 | 0.462 | 0.462 | 0.462 | 0.462 |
| Chromaticity coordinate values y | 0.409 | 0.409 | 0.409 | 0.409 | 0.409 | 0.410 | 0.410 | 0.410 | 0.410 | 0.410 | 0.410 |
| Correlated color temperature [K] | 2659 | 2660 | 2660 | 2661 | 2661 | 2662 | 2663 | 2663 | 2664 | 2665 | 2666 |

TABLE 11-continued

Spectral characteristics of simulated
white light-emitting devices S-6
(white LED (a), B-5; white LED (b), B-6)

| | | | | | | | | | | | |
|---|---|---|---|---|---|---|---|---|---|---|---|
| Duv | −0.7 | −0.7 | −0.7 | −0.6 | −0.6 | −0.6 | −0.5 | −0.5 | −0.4 | −0.4 | −0.3 |
| Ra | 83 | 85 | 86 | 88 | 90 | 92 | 94 | 96 | 98 | 98 | 95 |
| R9 | 40 | 45 | 51 | 57 | 63 | 69 | 76 | 83 | 90 | 98 | 93 |
| Maximum wavelength in red spectral region [nm] | 621 | 626 | 626 | 626 | 629 | 635 | 635 | 635 | 636 | 637 | 637 |
| 580-nm intensity ratio [%] | 107 | 106 | 105 | 104 | 102 | 101 | 99 | 98 | 96 | 94 | 92 |

Figure 12:
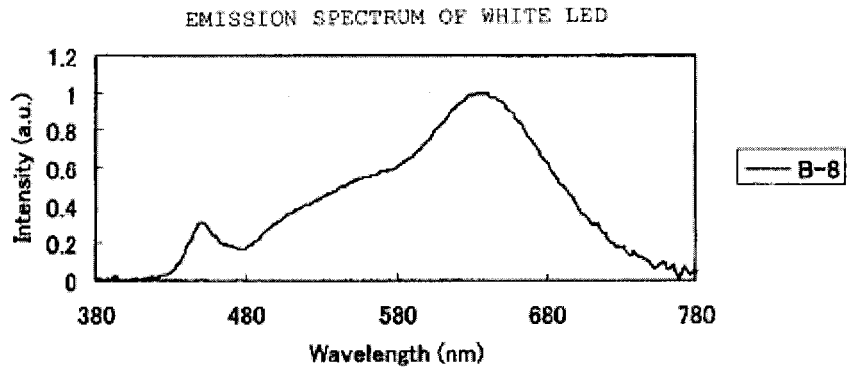
FIG. 12 shows an emission spectrum of a white LED.

B-7 and B-8 are white LED samples actually produced using a blue light-emitting diode element together with green phosphor CSMS, yellow phosphor YAG, and red phosphor CASN-2. Of these, B-8, which had a 580-nm intensity ratio of 93%, had highly excellent color rendering properties (Ra=98, R9=97). On the other hand, B-7, which had a 580-nm intensity ratio of 101%, did not have satisfactory reproducibility regarding bright red (R9=67), although high in color rendering index (Ra=91). In FIG. 12 is shown the emission spectrum of B-8.

Figure 13:
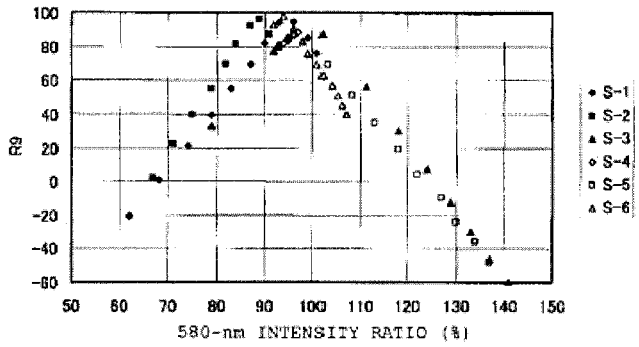
FIG. 13 shows a relationship between 580-nm intensity ratio and R9.

FIG. 13 is a graph obtained by plotting all values of the 580-nm intensity ratio and R9 of simulated white light-emitting devices S-1 to S-6 obtained through the six kinds of simulations shown in Table 6 to Table 11. The abscissa of the graph is 580-nm intensity ratio, and the ordinate thereof is R9. The results of the plotting indicate a specific tendency which is not affected by the kinds of light-component sources (light-emitting diode elements and phosphors) possessed by the light-emitting devices. Namely, there is a tendency that R9 has a peak at a 580-nm intensity ratio of about 90% and lower or higher values of 580-nm intensity ratio than that result in decreases in R9. Consequently, it is considered that the R9 of a white light-emitting semiconductor device may be improved by regulating the 580-nm intensity ratio thereof to a value in the range of 80-100%.

Figure 14:
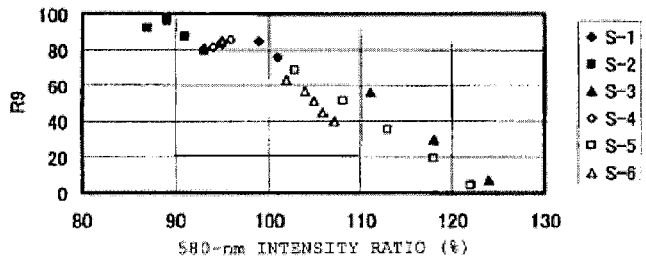
FIG. 14 shows another relationship between 580-nm intensity ratio and R9.

FIG. 14 shows the results of the same plotting as shown in FIG. 13 which was conducted with respect to simulated white light-emitting devices in each of which the maximum wavelength possessed by the spectrum of the outputted light in the red spectral region was 630 nm or less. It can be seen from the figure that the R9 is highest when the 580-nm intensity ratio is 90-100%.

Figure 15:
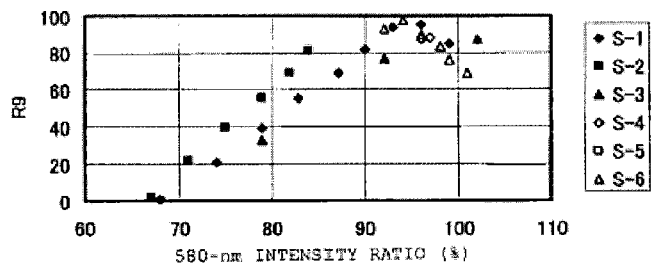
FIG. 15 shows still another relationship between 580-nm intensity ratio and R9.

FIG. 15 shows the results of the same plotting as shown in FIG. 13 which was conducted with respect to simulated white light-emitting devices in each of which the maximum wavelength possessed by the spectrum of the outputted light in the red spectral region was 630 nm or longer. It can be seen from the figure that the R9 is highest when the 580-nm intensity ratio is 85-100%, in particular, 85-95%.

The six kinds of simulations shown in Table 6 to Table 11 indicate that it is possible to improve the color rendering properties regarding bright red of a white light-emitting device by configuring the device so as to satisfy the second requirement described above, so long as the maximum wavelength possessed by the emission spectrum of the device in the red spectral region is in the range of 615-645 nm.

Tables 12 to 14 show the results obtained by simulating the emission characteristics of ideal white light-emitting devices each obtained by using two white LED samples considerably differing in color temperature in combination. In other words, the tables show the results obtained by calculating the emission characteristics of simulated white light-emitting devices in which the spectrum of the outputted light is a combined spectrum obtained by putting together the emission spectra of two white LED samples considerably differing in color temperature. In the simulations shown in each of Tables 12 to 14, the emission spectra of two white LED samples which each had been normalized with respect to luminous flux were put together in various proportions to produce combined spectra, and the chromaticity coordinate values, correlated color temperature, Duv, Ra, R9, and 580-nm intensity ratio were calculated on the basis of each combined spectrum.

TABLE 12

Spectral characteristics of simulated
white light-emitting devices S-7
(white LED (a), B-9; white LED (b), B-2)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity coordinate values x | 0.313 | 0.322 | 0.331 | 0.340 | 0.351 | 0.362 | 0.374 | 0.387 | 0.401 | 0.417 | 0.434 |
| Chromaticity coordinate values y | 0.327 | 0.332 | 0.338 | 0.344 | 0.350 | 0.357 | 0.364 | 0.372 | 0.381 | 0.391 | 0.401 |

TABLE 12-continued

Spectral characteristics of simulated
white light-emitting devices S-7
(white LED (a), B-9; white LED (b), B-2)

| | | | | | | | | | | | |
|---|---|---|---|---|---|---|---|---|---|---|---|
| Correlated color temperature [K] | 6488 | 6019 | 5581 | 5169 | 4785 | 4428 | 4098 | 3794 | 3517 | 3265 | 3036 |
| Duv | 1.7 | 0.3 | −1.0 | −2.2 | −3.1 | −3.7 | −4.0 | −3.9 | −3.3 | −2.3 | −0.6 |
| Ra | 94 | 95 | 95 | 95 | 95 | 95 | 96 | 96 | 96 | 97 | 96 |
| R9 | 95 | 92 | 90 | 90 | 89 | 90 | 92 | 95 | 98 | 96 | 90 |
| Maximum wavelength in red spectral region [nm] | 626 | 626 | 626 | 626 | 631 | 631 | 631 | 631 | 631 | 631 | 631 |
| 580-nm intensity ratio [%] | 92 | 92 | 92 | 93 | 92 | 92 | 93 | 93 | 93 | 93 | 94 |

TABLE 13

Spectral characteristics of simulated
white light-emitting devices S-8
(white LED (a), B-10; white LED (b), B-2)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity coordinate values x | 0.314 | 0.322 | 0.331 | 0.340 | 0.350 | 0.361 | 0.373 | 0.386 | 0.400 | 0.416 | 0.434 |
| Chromaticity coordinate values y | 0.330 | 0.335 | 0.340 | 0.346 | 0.352 | 0.358 | 0.365 | 0.373 | 0.382 | 0.391 | 0.401 |
| Correlated color temperature [K] | 6420 | 5986 | 5574 | 5181 | 4808 | 4457 | 4127 | 3820 | 3536 | 3275 | 3036 |
| Duv | 3.0 | 1.6 | 0.2 | −1.0 | −2.0 | −2.8 | −3.3 | −3.4 | −3.0 | −2.1 | −0.6 |
| Ra | 90 | 92 | 93 | 94 | 94 | 95 | 96 | 96 | 96 | 96 | 96 |
| R9 | 45 | 54 | 63 | 69 | 76 | 82 | 86 | 89 | 90 | 91 | 90 |
| Maximum wavelength in red spectral region [nm] | — | — | — | — | — | 618 | 621 | 624 | 629 | 629 | 631 |
| 580-nm intensity ratio [%] | 108 | 107 | 106 | 105 | 102 | 101 | 99 | 98 | 97 | 95 | 94 |

TABLE 14

Spectral characteristics of simulated
white light-emitting devices S-9
(white LED (a), B-9; white LED (b), B-4)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |

TABLE 14-continued

Spectral characteristics of simulated
white light-emitting devices S-9
(white LED (a), B-9; white LED (b), B-4)

| Chromaticity coordinate values | x | 0.313 | 0.323 | 0.333 | 0.343 | 0.355 | 0.367 | 0.379 | 0.393 | 0.407 | 0.422 | 0.439 |
|---|---|---|---|---|---|---|---|---|---|---|---|---|
| | y | 0.327 | 0.332 | 0.338 | 0.343 | 0.350 | 0.356 | 0.363 | 0.371 | 0.379 | 0.387 | 0.396 |
| Correlated color temperature [K] | | 6488 | 5964 | 5483 | 5042 | 4636 | 4266 | 3931 | 3630 | 3360 | 3118 | 2903 |
| Duv | | 1.7 | −0.2 | −2.0 | −3.5 | −4.7 | −5.6 | −6.1 | −6.2 | −5.7 | −4.8 | −3.4 |
| Ra | | 94 | 95 | 96 | 96 | 95 | 95 | 95 | 94 | 92 | 90 | 88 |
| R9 | | 95 | 97 | 97 | 93 | 89 | 83 | 75 | 66 | 57 | 47 | 37 |
| Maximum wavelength in red spectral region [nm] | | 626 | 624 | 618 | 618 | 618 | 615 | 615 | 615 | 613 | 611 | 611 |
| 580-nm intensity ratio [%] | | 92 | 94 | 96 | 98 | 99 | 101 | 103 | 104 | 106 | 108 | 110 |

Figure 16:
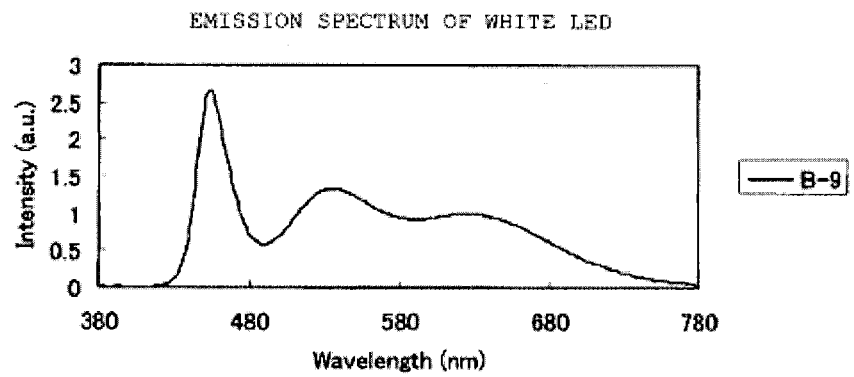
FIG. 16 shows an emission spectrum of a white LED.
Figure 17:
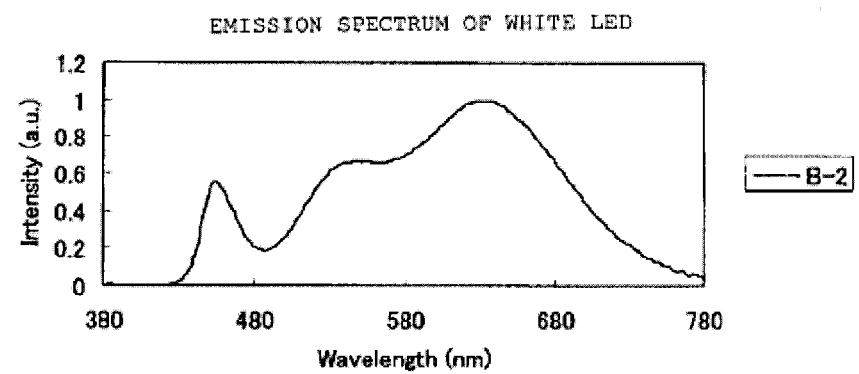
FIG. 17 shows an emission spectrum of a white LED.

Table 12 shows the results obtained by calculating the emission characteristics of simulated white light-emitting devices S-7 in which the spectrum of the outputted light is a combined spectrum obtained by putting the emission spectra of white LED samples B-9 (correlated color temperature, about 6,500K) and B-2 (correlated color temperature, about 3,000K) together. In FIG. 16 is shown the emission spectrum of white LED sample B-9. In FIG. 17 is shown the emission spectrum of white LED sample B-2. The correlated color temperature of simulated white light-emitting devices S-7 changes between the correlated color temperature of B-9 and the correlated color temperature of B-2, in accordance with the proportions of the emission spectra of B-9 and B-2 contained in the combined spectrum. Throughout the whole range of correlated color temperature of 3,000-6,500K, the simulated white light-emitting devices S-7 had a 580-nm intensity ratio of 92-94% and a special color rendering index R9 as high as 89-98.

Figure 18:
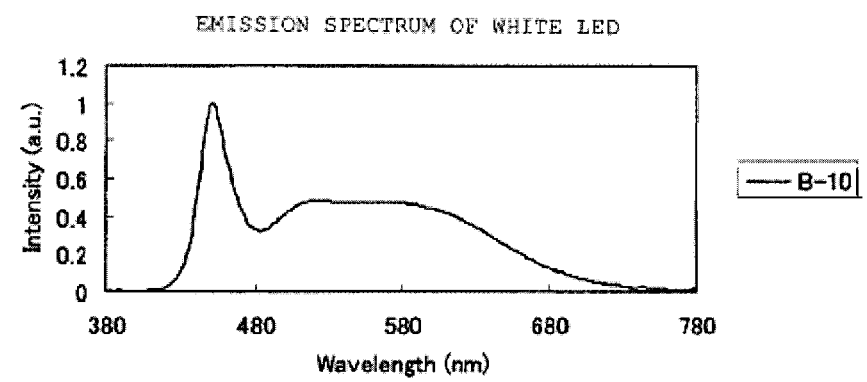
FIG. 18 shows an emission spectrum of a white LED.

Table 13 shows the results obtained by calculating the emission characteristics of simulated white light-emitting devices S-8 in which the spectrum of the outputted light is a combined spectrum obtained by putting the emission spectra of white LED sample B-10 (correlated color temperature, about 6,400K) and white LED sample B-2 (correlated color temperature, about 3,000K) together. In FIG. 18 is shown the emission spectrum of white LED sample B-10. B-10 is inferior in reproducibility regarding bright red, although high in color rendering index (Ra=90, R9=45). On the other hand, B-2 has a high color rendering index and further has excellent reproducibility regarding bright red (Ra=96, R9=90). The simulated white light-emitting devices S-8 had a color rendering index Ra as high as 90 or above even when the spectrum of the outputted light was the combined spectrum obtained by putting the emission spectrum of B-10 and the emission spectrum of B-2 together in any proportion. On the other hand, the R9 tended to increase as the proportion the emission spectrum of B-2 in the combined spectrum increased. There was a negative correlation between 580-nm intensity ratio and R9, and the R9 was as high as 86-91 when the 580-nm intensity ratio was lower than 100%.

Table 14 shows the emission characteristics of simulated white light-emitting devices S-9 in which the spectrum of the outputted light is a combined spectrum obtained by putting the emission spectra of white LED sample B-9 (correlated color temperature, about 6,500K) and white LED sample B-4 (correlated color temperature, about 2,900K) together. B-9 has a high color rendering index and further has excellent reproducibility regarding bright red (Ra=95, R9=94). On the other hand, B-4 is inferior in reproducibility regarding bright red, although high in color rendering index (Ra=88, R9=37). The simulated white light-emitting devices S-9 had a color rendering index Ra as high as 90 or above even when the spectrum of the outputted light was the combined spectrum obtained by putting the emission spectrum of B-9 and the emission spectrum of B-4 together in any proportion. On the other hand, the R9 tended to increase as the proportion the emission spectrum of B-9 in the combined spectrum increased. There was a negative correlation between 580-nm intensity ratio and R9, and the R9 was as high as 89-97 when the 580-nm intensity ratio was lower than 100%.

White LED samples which were not subjected to simulations are described below. V-8, V-9, V-10, and V-11, in which a purple light-emitting diode element is used as an excitation source for the phosphors, each satisfy the first requirement and the second requirement and have satisfactory reproducibility regarding bright red. These four white LED samples each differ in blue phosphor from the white LED samples which were subjected to simulations. The blue phosphor used in V-8 and V-9 differs from the blue phosphor used in V-10 and V-11. Furthermore, V-10 and V-11 each differ also in green phosphor from the white LED samples which were subjected to simulations.

B-1 and B-3, in which a blue light-emitting diode element is used as a source of blue light and as an excitation source for the phosphors, each satisfy the first requirement. The former further satisfies the second requirement. On the other hand, the latter does not satisfy the second requirement. White LED sample B1 is extremely high in both color rendering index Ra and special color rendering index R9 (Ra=97, R9=96). In contrast, white LED sample B-3 has a low value of special color rendering index R9, although the color rendering index Ra thereof is satisfactory (Ra=89, R9=43).

Embodiments of the invention include the white light-emitting semiconductor devices and illuminating device shown below.

(1) A white light-emitting semiconductor device which outputs light containing a blue light component, a green light component, and a red light component, wherein the blue light component includes light having any wavelength in the range of 440-480 nm, the green light component includes light having any wavelength in the range of 515-560 nm, and the red light component includes light having any wavelength in the range of 615-645 nm, a source of the blue light component comprises a light-emitting semiconductor element and/or a first phosphor that absorbs the light emitted by a light-emitting semiconductor element and emits, through wavelength conversion, light including the blue light component, a source of the green light component comprises a second phosphor that absorbs the light emitted by a light-emitting semiconductor element and emits, through wavelength conversion, light including the green light component, and a source of the red light component comprises a third phosphor that absorbs the light emitted by a light-emitting semiconductor element and emits, through wavelength conversion, light including the red light component, the outputted light has a spectrum which has a maximum wavelength in the range of 615-645 nm, and an intensity at a wavelength of 580 nm of the spectrum of the outputted light which has been normalized with respect to luminous flux is 80-100% of the intensity at a wavelength of 580 nm of an spectrum of standard light for color rendering evaluation which has been normalized with respect to luminous flux.

(2) The white light-emitting semiconductor device according to (1) above wherein the source of the blue light component includes a blue light-emitting semiconductor element.

(3) The white light-emitting semiconductor device according to (2) above wherein the blue light-emitting semiconductor element includes a blue light-emitting diode element having an emission peak wavelength in the range of 440-470 nm.

(4) The white light-emitting semiconductor device according to (3) above wherein the outputted light further includes light emitted by a light-emitting diode element having an emission peak wavelength in the range of 470-500 nm.

(5) The white light-emitting semiconductor device according to (4) above wherein the light-emitting diode element having an emission peak wavelength in the range of 470-500 nm includes a nonpolar or semipolar GaN substrate and a plurality of GaN-based semiconductor layers deposited on the substrate by epitaxial growth, and the plurality of GaN-based semiconductor layers include, as layers constituting a light-emitting device structure, a light-emitting InGaN layer and p-type and n-type clad layers between which the light-emitting InGaN layer has been sandwiched.

(6) The white light-emitting semiconductor device according to (1) above wherein the source of the blue light component includes the first phosphor, and the first phosphor includes a blue phosphor.

(7) The white light-emitting semiconductor device according to (6) above wherein an excitation source of the blue phosphor includes an InGaN-based light-emitting diode element having an emission peak wavelength in the range of 400-420 nm.

(8) The white light-emitting semiconductor device according to (6) or (7) above wherein the blue phosphor includes a phosphor composed of $Eu^{2+}$ as an activator and crystals containing an alkaline earth aluminate or alkaline earth halophosphate as a base.

(9) The white light-emitting semiconductor device according to (8) above wherein the blue phosphor includes one or more phosphors selected from $(Ba, Sr, Ca)MgAl_{10}O_{17}:Eu$, $(Ca, Sr, Ba)_5(PO_4)_3Cl:Eu$, $BaMgAl_{10}O_{17}:Eu$, and $Sr_{5-y}Ba_y(PO_4)_3Cl:Eu$ $(0<y<5)$.

(10) The white light-emitting semiconductor device according to any of (1) to (9) above wherein the second phosphor includes a green phosphor.

(11) The white light-emitting semiconductor device according to (10) above wherein the green phosphor includes a phosphor which is composed of $Eu^{2+}$ as an activator and crystals containing an alkaline earth silicate, alkaline earth silicate nitride, or Sialon as a base.

(12) The white light-emitting semiconductor device according to (11) above wherein the green phosphor includes one or more phosphors selected from $(Ba, Ca, Sr, Mg)_2SiO_4:Eu$, $(Ba, Sr, Ca)_2(Mg, Zn)Si_2O_7:Eu$, $(Ba, Ca, Sr)_3Si_6O_{12}N_2:Eu$, $(Ba, Ca, Sr)_3Si_6O_9N_4:Eu$, $(Ca, Sr, Ba)Si_2O_2N_2:Eu$, β-Sialon: Eu, $Sr_3Si_{13}Al_3O_2N_{21}:Eu$, and $Sr_5Al_5Si_{21}O_2N_{35}:Eu$.

(13) The white light-emitting semiconductor device according to any of (10) to (12) above wherein the green phosphor includes a phosphor which is composed of $Ce^{3+}$ as an activator and crystals containing a garnet-type oxide or alkaline earth metal scandate as a base.

(14) The white light-emitting semiconductor device according to (13) above wherein the green phosphor includes one or more phosphors selected from $Ca_3(Sc, Mg)_2Si_3O_{12}:Ce$ and $CaSc_2O_4:Ce$.

(15) The white light-emitting semiconductor device according to (10) above wherein the second phosphor includes a first green phosphor and a second green phosphor, and the second green phosphor has an emission spectrum in which the relative intensity at a wavelength of 580 nm, with the intensity at the peak wavelength being taken as 1, is lower than in the first green phosphor.

(16) The white light-emitting semiconductor device according to any of (1) to (15) above wherein the third phosphor includes a red phosphor.

(17) The white light-emitting semiconductor device according to (16) above wherein the third phosphor includes a red phosphor which has an emission band having a full width at half maximum of 80 nm or more.

(18) The white light-emitting semiconductor device according to (17) above wherein the red phosphor includes a phosphor which is composed of $Eu^{2+}$ as an activator and crystals containing an alkaline earth siliconitride, alkaline earth silicate nitride, α-Sialon, or alkaline earth silicate as a base.

(19) The white light-emitting semiconductor device according to (18) above wherein the red phosphor includes one or more phosphors selected from $(Ca, Sr, Ba)AlSiN_3:Eu$, $(Ca, Sr, Ba)_2Si_5N_8:Eu$, $SrAlSi_4N_7:Eu$, $(CaAlSiN_3)_{1-x}(Si_{(3n+2)/4}N_nO)_x:Eu$, $Ca_{1-x}Al_{1-x}Si_{1+x}N_{3-x}O_x:Eu$, and $(Sr, Ba)_3SiO_5:Eu$.

(20) The white light-emitting semiconductor device according to (16) above wherein the third phosphor includes a red phosphor which has an emission band having a full width at half maximum of 80 nm or more and has an emission peak wavelength of 625 nm or longer.

(21) The white light-emitting semiconductor device according to (16) or (20) above wherein the third phosphor includes a red phosphor which has an emission peak wavelength shorter than $\lambda_1$ and a red phosphor which has an emission peak wavelength of $\lambda_1$ or longer, $\lambda_1$ being any wavelength in the range of 625-655 nm.

(22) The white light-emitting semiconductor device according to (16) above wherein the third phosphor includes a first red phosphor and a second red phosphor, and the second red phosphor has an emission spectrum in which the relative intensity at a wavelength of 580 nm, with the intensity at the peak wavelength being taken as 1, is lower than in the first red phosphor.

(23) The white light-emitting semiconductor device according to (22) above wherein the difference between the relative intensity at a wavelength of 580 nm of the emission spectrum of the first red phosphor, with the intensity at the peak wavelength being taken as 1, and the relative intensity at a wavelength of 580 nm of the emission spectrum of the second red phosphor, with the intensity at the peak wavelength being taken as 1, is 0.2 or more.

(24) The white light-emitting semiconductor device according to (23) above wherein the difference between the relative intensity at a wavelength of 580 nm of the emission spectrum of the first red phosphor, with the intensity at the peak wavelength being taken as 1, and the relative intensity at a wavelength of 580 nm of the emission spectrum of the second red phosphor, with the intensity at the peak wavelength being taken as 1, is 0.3 or more.

(25) The white light-emitting semiconductor device according to any of (22) to (24) above wherein the second red phosphor has a longer emission peak wavelength than the first red phosphor.

(26) The white light-emitting semiconductor device according to any of (22) to (25) above wherein the first red phosphor and the second red phosphor each have an emission peak wavelength in the range of 630-655 nm.

(27) The white light-emitting semiconductor device according to (22) above wherein the first red phosphor includes $Sr_xCa_{1-x}AlSiN_3$:Eu (0<x<1), $Ca_{1-x}Al_{1-x}Si_{1+x}N_{3-x}O$:Eu, or $SrAlSi_4N_7$:Eu.

(28) The white light-emitting semiconductor device according to (27) above wherein the second red phosphor has an emission spectrum in which the relative intensity at a wavelength of 580 nm, with the intensity at the peak wavelength being taken as 1, is 0.05 or less.

(29) The white light-emitting semiconductor device according to (27) or (28) above wherein the second red phosphor includes $CaAlSiN_3$:Eu.

(30) The white light-emitting semiconductor device according to any of (1) to (29) above wherein the second phosphor and/or the third phosphor includes a yellow phosphor.

(31) The white light-emitting semiconductor device according to (30) above wherein the yellow phosphor includes a phosphor which is composed of $Ce^{3+}$ as an activator and crystals containing a garnet-type oxide or lanthanum siliconitride as a base.

(32) The white light-emitting semiconductor device according to (31) above wherein the yellow phosphor includes one or more phosphors selected from $(Y, Gd)_3Al_5O_{12}$:Ce, $Tb_3Al_5O_{12}$:Ce, $La_3Si_6N_{11}$:Ce, and $Ca_{1.5x}La_{3-x}Si_6N_{11}$:Ce.

(33) The white light-emitting semiconductor device according to any of (1) to (32) above wherein none of the sources of the blue light component, green light component, and green light component includes a phosphor containing, as a base, crystals of a sulfur-containing compound.

(34) The white light-emitting semiconductor device according to any of (1) to (33) above wherein the outputted light has deviations Duv from the black-body radiation locus in the range of −6.0 to +6.0.

(35) The white light-emitting semiconductor device according to any of (1) to (34) above wherein the outputted light has a correlated color temperature of 2,000K to 6,500K.

(36) The white light-emitting semiconductor device according to (35) above wherein the outputted light has a correlated color temperature of 2,000K to 4,000K.

(37) The white light-emitting semiconductor device according to any of (1) to (36) above wherein the outputted light has a spectrum which has a maximum wavelength in the range of 615 nm to 630 nm, excluding 630 nm, and an intensity at a wavelength of 580 nm of the spectrum of the outputted light which has been normalized with respect to luminous flux is 85-100% of an intensity at a wavelength of 580 nm of the spectrum of standard light for color rendering evaluation which has been normalized with respect to luminous flux.

(38) The white light-emitting semiconductor device according to any of (1) to (36) above wherein the outputted light has a spectrum which has a maximum wavelength in the range of 630-645 nm, and an intensity at a wavelength of 580 nm of the spectrum of the outputted light which has been normalized with respect to luminous flux is 90-100% of an intensity at a wavelength of 580 nm of the spectrum of standard light for color rendering evaluation which has been normalized with respect to luminous flux.

(39) An illuminating device which includes the white light-emitting semiconductor device according to any of (1) to (38) above.

Embodiments of the invention include the white light-emitting units and illuminating device shown below.

(40) A white light-emitting unit which emits white light containing a blue light component, a green light component, and a red light component, wherein the blue light component includes light having any wavelength in the range of 440-480 nm, the green light component includes light having any wavelength in the range of 515-560 nm, and the red light component includes light having any wavelength in the range of 615-645 nm, the white light-emitting unit is equipped with a light-emitting semiconductor element that emits light including the blue light component, a second phosphor that absorbs the light emitted by the light-emitting semiconductor element and emits, through wavelength conversion, light including the green light component, and a third phosphor that absorbs the light emitted by the light-emitting semiconductor element and emits, through wavelength conversion, light including the red light component, the white light has a spectrum which has a maximum wavelength in the range of 615-645 nm, and an intensity at a wavelength of 580 nm of the spectrum of the white light which has been normalized with respect to luminous flux is 80-100% of an intensity at a wavelength of 580 nm of the spectrum of standard light for color rendering evaluation which has been normalized with respect to luminous flux.

(41) The white light-emitting unit according to (40) above wherein the light-emitting semiconductor element includes a blue light-emitting semiconductor element.

(42) The white light-emitting unit according to (41) above wherein the blue light-emitting semiconductor element includes a blue light-emitting diode element having an emission peak wavelength in the range of 440-470 nm.

(43) The white light-emitting unit according to (42) above which is further equipped with a light-emitting diode element having an emission peak wavelength in the range of 470-500 nm, as a source of the blue light component and/or the green light component.

(44) The white light-emitting unit according to (43) above wherein the light-emitting diode element having an emission peak wavelength in the range of 470-500 nm includes a non-polar or semipolar GaN substrate and a plurality of GaN-based semiconductor layers deposited on the substrate by epitaxial growth, and the plurality of GaN-based semiconductor layers include, as layers constituting a light-emitting device structure, a light-emitting InGaN layer and p-type and n-type clad layers between which the light-emitting InGaN layer has been sandwiched.

(45) A white light-emitting unit which emits white light containing a blue light component, a green light component, and a red light component, wherein the blue light component includes light having any wavelength in the range of 440-480 nm, the green light component includes light having any wavelength in the range of 515-560 nm, and the red light component includes light having any wavelength in the range of 615-645 nm, the white light-emitting unit is equipped with a light-emitting semiconductor element, a first phosphor that absorbs the light emitted by the light-emitting semiconductor element and emits, through wavelength conversion, light including the blue light component, a second phosphor that absorbs the light emitted by the light-emitting semiconductor element and emits, through wavelength conversion, light including the green light component, and a third phosphor that absorbs the light emitted by the light-emitting semiconductor element and emits, through wavelength conversion, light including the red light component, the white light has a spectrum which has a maximum wavelength in the range of 615-645 nm, and an intensity at a wavelength of 580 nm of the spectrum of the white light which has been normalized with respect to luminous flux is 80-100% of the intensity at a wavelength of 580 nm of the spectrum of standard light for color rendering evaluation which has been normalized with respect to luminous flux.

(46) The white light-emitting unit according to (45) above wherein the first phosphor includes a blue phosphor.

(47) The white light-emitting unit according to (46) above wherein the light-emitting semiconductor element includes an InGaN-based purple light-emitting diode element having an emission peak wavelength in the range of 400-420 nm.

(48) The white light-emitting unit according to (46) or (47) above wherein the blue phosphor includes a phosphor composed of $Eu^{2+}$ as an activator and crystals containing an alkaline earth aluminate or alkaline earth halophosphate as a base.

(49) The white light-emitting unit according to (48) above wherein the blue phosphor includes one or more phosphors selected from $(Ba, Sr, Ca)MgAl_{10}O_{17}:Eu$, $(Ca, Sr, Ba)_5(PO_4)_3Cl:Eu$, $BaMgAl_{10}O_{17}:Eu$, and $Sr_{5-y}Ba_y(PO_4)_3Cl:Eu$ $(0<y<5)$.

(50) The white light-emitting unit according to any of (40) to (49) above wherein the second phosphor includes a green phosphor.

(51) The white light-emitting unit according to (50) above wherein the green phosphor includes a phosphor which is composed of $Eu^{2+}$ as an activator and crystals containing an alkaline earth silicate, alkaline earth silicate nitride, or Sialon as a base.

(52) The white light-emitting unit according to (51) above wherein the green phosphor includes one or more phosphors selected from $(Ba, Ca, Sr, Mg)_2SiO_4:Eu$, $(Ba, Sr, Ca)_2(Mg, Zn)Si_2O_7:Eu$, $(Ba, Ca, Sr)_3Si_6O_{12}N_2:Eu$, $(Ba, Ca, Sr)_3Si_6O_9N_4:Eu$, $(Ca, Sr, Ba)Si_2O_2N_2:Eu$, β-Sialon:Eu, $Sr_3Si_{13}Al_3O_2N_{21}:Eu$, and $Sr_5Al_5Si_{21}O_2N_{35}:Eu$.

(53) The white light-emitting unit according to any of (50) to (52) above wherein the green phosphor includes a phosphor which is composed of $Ce^{3+}$ as an activator and crystals containing a garnet-type oxide or alkaline earth metal scandate as a base.

(54) The white light-emitting unit according to (53) above wherein the green phosphor includes one or more phosphors selected from $Ca_3(Sc, Mg)_2Si_3O_{12}:Ce$ and $CaSc_2O_4:Ce$.

(55) The white light-emitting unit according to (50) above wherein the second phosphor includes a first green phosphor and a second green phosphor, and the second green phosphor has an emission spectrum in which the relative intensity at a wavelength of 580 nm, with the intensity at the peak wavelength being taken as 1, is lower than in the first green phosphor.

(56) The white light-emitting unit according to any of (40) to (55) above wherein the third phosphor includes a red phosphor.

(57) The white light-emitting unit according to (56) above wherein the third phosphor includes a red phosphor which has an emission band having a full width at half maximum of 80 nm or more.

(58) The white light-emitting unit according to (57) above wherein the red phosphor includes a phosphor which is composed of $Eu^{2+}$ as an activator and crystals containing an alkaline earth siliconitride, alkaline earth silicate nitride, α-Sialon, or alkaline earth silicate as a base.

(59) The white light-emitting unit according to (58) above wherein the red phosphor includes one or more phosphors selected from $(Ca, Sr, Ba)AlSiN_3:Eu$, $(Ca, Sr, Ba)_2Si_5N_8:Eu$, $SrAlSi_4N_7:Eu$, $(CaAlSiN_3)_{1-x}(Si_{(3n+2)/4}N_nO)_x:Eu$, and $(Sr, Ba)_3SiO_5:Eu$.

(60) The white light-emitting unit according to (56) above wherein the third phosphor includes a red phosphor which has an emission band having a full width at half maximum of 80 nm or more and has an emission peak wavelength of 625 nm or longer.

(61) The white light-emitting unit according to (56) or (60) above wherein the third phosphor includes a red phosphor which has an emission peak wavelength shorter than $\lambda_1$ and a red phosphor which has an emission peak wavelength of $\lambda_1$ or longer, $\lambda_1$ being any wavelength in the range of 625-655 nm.

(62) The white light-emitting unit according to (56) above wherein the third phosphor includes a first red phosphor and a second red phosphor, and the second red phosphor has an emission spectrum in which the relative intensity at a wavelength of 580 nm, with the intensity at the peak wavelength being taken as 1, is lower than in the first red phosphor.

(63) The white light-emitting unit according to (62) above wherein the difference between the relative intensity at a wavelength of 580 nm of the emission spectrum of the first red phosphor, with the intensity at the peak wavelength being taken as 1, and the relative intensity at a wavelength of 580 nm of the emission spectrum of the second red phosphor, with the intensity at the peak wavelength being taken as 1, is 0.2 or more.

(64) The white light-emitting unit according to (63) above wherein the difference between the relative intensity at a wavelength of 580 nm of the emission spectrum of the first red phosphor, with the intensity at the peak wavelength being taken as 1, and the relative intensity at a wavelength of 580 nm of the emission spectrum of the second red phosphor, with the intensity at the peak wavelength being taken as 1, is 0.3 or more.

(65) The white light-emitting unit according to any of (62) to (64) above wherein the second red phosphor has a longer emission peak wavelength than the first red phosphor.

(66) The white light-emitting unit according to any of (62) to (65) above wherein the first red phosphor and the second red phosphor each have an emission peak wavelength in the range of 630-655 nm.

(67) The white light-emitting unit according to (62) above wherein the first red phosphor includes $Sr_xCa_{1-x}AlSiN_3:Eu$ ($0<x<1$), $Ca_{1-x}Al_{1-x}Si_{1+x}N_{3-x}O_x:Eu$, or $SrAlSi_4N_7:Eu$.

(68) The white light-emitting unit according to (67) above wherein the second red phosphor has an emission spectrum in which the relative intensity at a wavelength of 580 nm, with the intensity at the peak wavelength being taken as 1, is 0.05 or less.

(69) The white light-emitting unit according to (67) or (68) above wherein the second red phosphor includes $CaAlSiN_3:Eu$.

(70) The white light-emitting unit according to any of (40) to (69) above wherein the second phosphor and/or the third phosphor includes a yellow phosphor.

(71) The white light-emitting unit according to (70) above wherein the yellow phosphor includes a phosphor which is composed of $Ce^{3+}$ as an activator and crystals containing a garnet-type oxide or lanthanum siliconitride as a base.

(72) The white light-emitting unit according to (71) above wherein the yellow phosphor includes one or more phosphors selected from $(Y, Gd)_3Al_5O_{12}$:Ce, $Tb_3Al_5O_{12}$:Ce, $La_3Si_6N_{11}$:Ce, and $Ca_{1.5x}La_{3-x}Si_6N_{11}$:Ce.

(73) The white light-emitting unit according to any of (40) to (72) above which does not include a phosphor containing, as a base, crystals of a sulfur-containing compound.

(74) The white light-emitting unit according to any of (40) to (73) above wherein the white light has deviations Duv from the black-body radiation locus in the range of −6.0 to +6.0.

(75) The white light-emitting unit according to any of (40) to (74) above wherein the white light has a correlated color temperature of 2,000K to 6,500K.

(76) The white light-emitting unit according to (75) above wherein the white light has a correlated color temperature of 2,000K to 4,000K.

(77) The white light-emitting unit according to any of (40) to (76) above wherein the white light has a spectrum which has a maximum wavelength in the range of 615 nm to 630 nm, excluding 630 nm, and an intensity at a wavelength of 580 nm of the spectrum of the white light which has been normalized with respect to luminous flux is 85-100% of an intensity at a wavelength of 580 nm of the spectrum of standard light for color rendering evaluation which has been normalized with respect to luminous flux.

(78) The white light-emitting unit according to any of (40) to (76) above wherein the white light has a spectrum which has a maximum wavelength in the range of 630-645 nm, and an intensity at a wavelength of 580 nm of the spectrum of the white light which has been normalized with respect to luminous flux is 90-100% of the intensity at a wavelength of 580 nm of the spectrum of standard light for color rendering evaluation which has been normalized with respect to luminous flux.

(79) An illuminating device which includes the white light-emitting unit according to any of (40) to (78) above.

Embodiments of the invention include the white light-emitting semiconductor devices and illuminating device shown below.

(80) A white light-emitting semiconductor device which has first to Nth (wherein N is an integer of 2 or larger) white light-emitting units each equipped with a light-emitting semiconductor element and a wavelength conversion part, and in which the first to Nth white light-emitting units each emit primary white light and the primary white light emitted by the units is mixed together, the resultant combined light being emitted as outputted light, wherein the first to Nth white light-emitting units comprise a white light-emitting unit which emits first primary white light and a white light-emitting unit which emits second primary white light, an intensity at a wavelength of 580 nm of the spectrum of the first primary white light which has been normalized with respect to luminous flux is higher than an intensity at a wavelength of 580 nm of the spectrum of standard light for color rendering evaluation which has been normalized with respect to luminous flux, an intensity at a wavelength of 580 nm of the spectrum of the second primary white light which has been normalized with respect to luminous flux is lower than an intensity at a wavelength of 580 nm of the spectrum of standard light for color rendering evaluation which has been normalized with respect to luminous flux, and the outputted light has a spectrum which has a maximum wavelength in the range of 615-645 nm, an intensity at a wavelength of 580 nm of the spectrum of the outputted light which has been normalized with respect to luminous flux is 80-100% of an intensity at a wavelength of 580 nm of the spectrum of standard light for color rendering evaluation which has been normalized with respect to luminous flux.

(81) The white light-emitting semiconductor device according to (80) above wherein the white light-emitting unit which emits first primary white light is equipped with a wavelength conversion part including a first red phosphor, and the white light-emitting unit which emits second primary white light is equipped with a wavelength conversion part including a second red phosphor, the second red phosphor having an emission spectrum in which the relative intensity at a wavelength of 580 nm, with the intensity at the peak wavelength being taken as 1, is lower than in the first red phosphor.

(82) The white light-emitting semiconductor device according to (81) above wherein the first primary white light and the second primary white light differ from each other in reciprocal correlated color temperature by 50 $MK^{-1}$ or less.

(83) The white light-emitting semiconductor device according to (82) above wherein the first primary white light and the second primary white light differ from each other in reciprocal correlated color temperature by 25 $MK^{-1}$ or less.

(84) The white light-emitting semiconductor device according to any of (80) to (83) above which is equipped with a control circuit for controlling both the electric power to be applied to the white light-emitting unit that emits the first primary white light and the electric power to be applied to the white light-emitting unit that emits the second primary white light and thereby regulating the proportion of the first primary white light in the outputted light and the proportion of the second primary white light therein.

(85) An illuminating device which includes the white light-emitting semiconductor device according to any of (80) to (84) above.

While the invention has been described in detail and with reference to specific embodiments thereof, it will be apparent to one skilled in the art that various changes and modifications can be made therein without departing from the spirit and scope thereof. This application is based on a Japanese patent application filed on Aug. 26, 2009 (Application No. 2009-195765), a Japanese patent application filed on Feb. 1, 2010 (Application No. 2010-20482), a Japanese patent application filed on Mar. 3, 2010 (Application No. 2010-47173), a Japanese patent application filed on Jun. 25, 2010 (Application No. 2010-145095), and a Japanese patent application filed on Aug. 9, 2010 (Application No. 2010-179063), the contents thereof being incorporated herein by reference.

The invention claimed is:

1. A white light-emitting unit which emits white light containing a blue light component, a green light component, and a red light component, wherein
   the blue light component includes light having any wavelength in the range of 440-480 nm,
   the green light component includes light having any wavelength in the range of 515-560 nm, and
   the red light component includes light having any wavelength in the range of 615-645 nm,
   the white light-emitting unit comprises:
   a light-emitting semiconductor element that emits light including the blue light component,
   a first phosphor that absorbs the light emitted by the light-emitting semiconductor element and emits, through wavelength conversion, light including the green light component, and
   a second phosphor that absorbs the light emitted by the light-emitting semiconductor element and emits, through wavelength conversion, light including the red light component, a weight ratio of the second phosphor to the first phosphor is in a range of 0.39 to 1.23, the first phosphor does not comprise $Ba_{1.88}Eu_{0.12}Si_6O_8N_4$, the white light has a spectrum which has a maximum wavelength in the range of 615-645 nm, and an intensity at a wavelength of 580 nm of the spectrum of the white light which has been normalized with respect to luminous flux is 80-100% of an intensity at a wavelength of 580 nm of the spectrum of standard light for color rendering evaluation which has been normalized with respect to luminous flux.

2. The white light-emitting unit according to claim 1, wherein the first phosphor comprises one or more phosphors selected from green phosphors which comprise $Eu^{2+}$ as an activator and crystals containing an alkaline earth silicate, an alkaline earth silicate nitride, or Sialon as a base, and green phosphors which comprise $Ce^{3+}$ as an activator and crystals containing a garnet-type oxide or an alkaline earth metal scandate as a base.

3. The white light-emitting unit according to claim 1, wherein the first phosphor comprises a green phosphor and a yellow phosphor.

4. The white light-emitting unit according to claim 1, wherein the white light has a spectrum which has a maximum wavelength in the range of 615 nm or more and less than 630 nm, and an intensity at a wavelength of 580 nm of the spectrum of the white light which has been normalized with respect to luminous flux is 85-100% of an intensity at a wavelength of 580 nm of the spectrum of standard light for color rendering evaluation which has been normalized with respect to luminous flux.

5. The white light-emitting unit according to claim 1, wherein the white light has a spectrum which has a maximum wavelength in the range of 630-645 nm, and an intensity at a wavelength of 580 nm of the spectrum of the white light which has been normalized with respect to luminous flux is 90-100% of the intensity at a wavelength of 580 nm of the spectrum of standard light for color rendering evaluation which has been normalized with respect to luminous flux.

6. The white light-emitting unit according to claim 1, wherein the second phosphor comprises a first red phosphor and a second red phosphor, and the second red phosphor has a lower relative intensity at a wavelength of 580 nm in an emission spectrum, when the intensity at the peak wavelength is taken as 1, than in the first red phosphor.

7. A white light-emitting semiconductor device comprising first to Nth (wherein N is an integer of 2 or larger) white light-emitting units each equipped with a light-emitting semiconductor element and a wavelength conversion part, in which the first to Nth white light-emitting units each emit primary white light and the primary white light emitted by the units is mixed together, to form combined light as outputted light, wherein the first to Nth white light-emitting units comprise a white light-emitting unit which emits first primary white light and a white light-emitting unit which emits second primary white light, an intensity at a wavelength of 580 nm of the spectrum of the first primary white light which has been normalized with respect to luminous flux is higher than an intensity at a wavelength of 580 nm of the spectrum of standard light for color rendering evaluation which has been normalized with respect to luminous flux, an intensity at a wavelength of 580 nm of the spectrum of the second primary white light which has been normalized with respect to luminous flux is lower than an intensity at a wavelength of 580 nm of the spectrum of standard light for color rendering evaluation which has been normalized with respect to luminous flux, the outputted light has a spectrum which has a maximum wavelength in the range of 615-645 nm, and an intensity at a wavelength of 580 nm of the spectrum of the outputted light which has been normalized with respect to luminous flux is 80-100% of an intensity at a wavelength of 580 nm of the spectrum of standard light for color rendering evaluation which has been normalized with respect to luminous flux, and at least one of the first to Nth white light-emitting units emits white light containing a blue light component, a green light component, and a red light component, wherein the blue light component includes light having any wavelength in the range of 440-480 nm, the green light component includes light having any wavelength in the range of 515-560 nm, and the red light component includes light having any wavelength in the range of 615-645 nm, and this at least one white light-emitting unit comprises:

a light-emitting semiconductor element that emits light including the blue light component, a first phosphor that absorbs the light emitted by the light-emitting semiconductor element and emits, through wavelength conversion, light including the green light component, and a second phosphor that absorbs the light emitted by the light-emitting semiconductor element and emits, through wavelength conversion, light including the red light component, wherein a weight ratio of the second phosphor to the first phosphor is in a range of 0.39 to 1.23, and the first phosphor does not comprise $Ba_{1.88}Eu_{0.12}Si_6O_8N_4$.

8. The white light-emitting semiconductor device according to claim 7, wherein the white light-emitting unit which emits first primary white light comprises a wavelength conversion part including a first red phosphor, and the white light-emitting unit which emits second primary white light comprises a wavelength conversion part including a second red phosphor, and the second red phosphor has a lower relative intensity at a wavelength of 580 nm in an emission spectrum, when the intensity at the peak wavelength is taken as 1, than in the first red phosphor.

9. The white light-emitting semiconductor device according to claim 7, wherein a difference in reciprocal correlated color temperature between the first primary white light and the second primary white light is 50 $MK^{-1}$ or less.

10. An illuminating device comprising the white light-emitting unit according to claim 1.

11. The white light-emitting unit according to claim 1, wherein the first phosphor comprises at least one compound selected from the group consisting of BSS, BSON, β-SiAlON, CSMS and CSO.

12. The white light-emitting unit according to claim 1, wherein the second phosphor comprises calcium.

13. The white light-emitting unit according to claim 1, wherein the second phosphor comprises at least one compound selected from the group consisting of CASON-1, CASON-2, SCASN and CASN-2.

14. The white light-emitting unit according to claim 1, wherein the first phosphor comprises at least one compound selected from the group consisting of an $Eu^{2-}$-activated alkaline earth silicate, an $Eu^{2+}$-activated alkaline earth silicate nitride, an $Eu^{2+}$-activated Sialon, a $Ce^{3+}$-activated garnet oxide, and a $Ce^{3+}$-activated alkaline earth metal scandate.

15. The white light-emitting unit according to claim 14, wherein the $Eu^{2+}$-activated alkaline earth silicate nitride comprises at least one compound selected from the group consisting of $(Ba, Ca, Sr)_3Si_6O_{12}N_2$:Eu, $(Ba, Ca, Sr)_3Si_6O_9N_4$:Eu, and $(Ba, Ca, Sr)Si_2O_2N_2$:Eu.

* * * * *